(12) United States Patent
Bult et al.

(10) Patent No.: US 7,906,992 B2
(45) Date of Patent: *Mar. 15, 2011

(54) HIGH SPEED LATCH COMPARATORS

(75) Inventors: Klaas Bult, Bosch en Duin (NL); Rudy Van de Plassche, Waalbe (NL); Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/040,805

(22) Filed: Feb. 29, 2008

(65) Prior Publication Data

US 2008/0143391 A1 Jun. 19, 2008

Related U.S. Application Data

(60) Division of application No. 10/649,808, filed on Aug. 28, 2003, now Pat. No. 7,352,215, which is a continuation of application No. 10/083,463, filed on Feb. 27, 2002, now Pat. No. 6,639,430.

(60) Provisional application No. 60/271,425, filed on Feb. 27, 2001.

(51) Int. Cl.
*G01R 19/00* (2006.01)
*G11C 7/00* (2006.01)
(52) U.S. Cl. ............................. 327/55; 327/57
(58) Field of Classification Search .................. None
See application file for complete search history.

(56) References Cited

U.S. PATENT DOCUMENTS

| | | | |
|---|---|---|---|
| 4,169,233 A | 9/1979 | Haraszti | |
| 4,521,703 A | 6/1985 | Dingwall | |
| 4,551,641 A | 11/1985 | Pelley | |
| 4,816,706 A | 3/1989 | Dhong et al. | |
| 4,855,628 A | 8/1989 | Jun | |
| 5,245,223 A | 9/1993 | Lim et al. | |
| 5,438,287 A | 8/1995 | Faue | |
| 5,486,779 A | 1/1996 | Eitrheim | |
| 5,537,066 A * | 7/1996 | Kawashima | 327/55 |
| 5,808,487 A | 9/1998 | Roy | |
| 5,903,171 A | 5/1999 | Shieh | |
| 5,963,060 A | 10/1999 | Varadarajan et al. | |
| 5,963,495 A | 10/1999 | Kumar | |
| 5,977,798 A | 11/1999 | Zerbe | |
| 6,002,270 A | 12/1999 | Timoc | |
| 6,008,673 A | 12/1999 | Glass et al. | |
| 6,011,421 A | 1/2000 | Jung | |
| 6,032,140 A * | 2/2000 | Fabbrizio et al. | 706/15 |
| 6,060,912 A * | 5/2000 | Opris et al. | 327/57 |
| 6,069,512 A | 5/2000 | Rodriguez et al. | |

(Continued)

OTHER PUBLICATIONS

Millman, J. and Grabel, A., *Microelectronics: Second Edition*, McGraw-Hill, pp. ix-xvi and 719-726 (1987).

(Continued)

*Primary Examiner* — Tuan Lam
(74) *Attorney, Agent, or Firm* — Sterne, Kessler, Goldstein & Fox P.L.L.C.

(57) ABSTRACT

In a latch circuit having a bistable pair of cross connected transistors of a first polarity and a third transistor of a second polarity, a current signal greater than a bias current is received at a latch circuit port, amplified with the third transistor, and applied to the latch circuit port. This decreases the time in which the latch circuit port receiving the current signal greater than the bias current reaches a steady state voltage.

24 Claims, 15 Drawing Sheets

U.S. PATENT DOCUMENTS

| | | |
|---|---|---|
| 6,072,416 A | 6/2000 | Shima |
| 6,147,514 A | 11/2000 | Shiratake |
| 6,147,515 A | 11/2000 | Ang et al. |
| 6,163,193 A | 12/2000 | Kong |
| 6,184,722 B1 | 2/2001 | Hayakawa |
| 6,191,624 B1 | 2/2001 | Matsuya |
| 6,281,713 B1 | 8/2001 | Kim |
| 6,392,449 B1 | 5/2002 | Taft |
| 6,433,586 B2 | 8/2002 | Ooishi |
| 6,483,353 B2 | 11/2002 | Kim et al. |
| 6,501,320 B1 | 12/2002 | Le |
| 6,825,696 B2 | 11/2004 | Jaussi et al. |
| 2001/0048141 A1 | 12/2001 | Lin et al. |

OTHER PUBLICATIONS

Noriega, G., *Sigma-Delta A/D Converters—Audio and Medium Bandwidths*, from http://www.rmsinst.com/dt3.htm, RMS Instruments, 7 pages (Feb. 1996).

English-language Abstract of JP 63-087014, published Apr. 18, 1988, 1 page.

International Search Report of Appln. No. PCT/US02/05655, issued May 8, 2003, 6 pages.

\* cited by examiner

900

902 AMPLIFY, WITH THE THIRD TRANSISTOR, THE CURRENT SIGNAL GREATER THAN THE BIAS CURRENT

904 APPLY THE AMPLIFIED CURRENT SIGNAL TO THE LATCH CIRCUIT PORT RECEIVING THE CURRENT SIGNAL GREATER THAN THE BIAS CURRENT

1802 RESET THE BISTABLE PAIR AND THE VERTICAL LATCH

1804 HOLD THE FOURTH MOSFET OFF DURING THE RESETTING

1806 HOLD THE THIRD MOSFET OFF DURING THE RESETTING

1808 AFTER THE RESETTING, HOLD THE FOURTH MOSFET OFF WHEN THE SECOND MOSFET CHANGES STATE FROM ON TO OFF

FIG.18

HIGH SPEED LATCH COMPARATORS

CROSS-REFERENCE TO RELATED APPLICATIONS

This application is a divisional of U.S. application Ser. No. 10/649,808, filed Aug. 28, 2003, now U.S. Pat. No. 7,352,215, which is a continuation of U.S. application Ser. No. 10/083,463, filed Feb. 27, 2002, now U.S. Pat. No. 6,639,430, which claims the benefit of U.S. Provisional Application No. 60/271,425, filed Feb. 27, 2001, each of which is incorporated herein in its entirety by reference.

BACKGROUND OF THE INVENTION

1. Field of the Invention

The present invention relates to high speed latch comparators.

2. Background Art

Commercialization of the Internet has proven to be a mainspring for incentives to improve network technologies. Development programs have pursued various approaches including strategies to leverage use of the existing Public Switched Telephone Network and plans to expand use of wireless technologies for networking applications. Both of these approaches (and others) entail the conversion of data between analog and digital formats. Therefore, it is expected that analog-to-digital converters (ADCs) and digital-to-analog converters (DACs) will continue to perform critical functions in many network applications.

Because ADCs find uses in a wide variety of applications, design of these circuits has evolved along many paths to yield several distinct architectures, including "delta sigma," "successive approximation," "pipelined," and "flash." Each architecture has its benefits and drawbacks. Paramount among these is a tradeoff between bandwidth and degree of resolution. FIG. 1 is a graph 100 that shows the tradeoff between bandwidth and degree of resolution for the various ADC architectures. Graph 100 comprises a "degree of resolution" axis 102 and a "bandwidth" axis 104. The relative positions of the different ADC architectures are plotted with respect to axes 102, 104: a "delta sigma" region 106, a "successive approximation" region 108, a "pipelined" region 110, and a "flash" region 112. In the design of network technologies, data conversion has often presented itself as a bottleneck that impedes the rate at which information is transmitted. Therefore, those ADC architectures that can support large bandwidths for rapid transfers of data have been favored for network applications.

FIG. 2A is a block diagram of an exemplary conventional two-bit flash ADC 200. ADC 200 comprises a first comparator "A" 202, a second comparator "B" 204, a third comparator "C" 206, a priority encoder 208, a first resistor "$R_1$" 210, a second resistor "$R_2$" 212, a third resistor "$R_3$" 214, and a fourth resistor "$R_4$" 216. Each of $R_1$ 210, $R_2$ 212, $R_3$ 214, and $R_4$ 216 has the same measure of resistance. $R_1$ 210, $R_2$ 212, $R_3$ 214, and $R_4$ 216 are connected in series between an analog ground "$V_{AG}$" 218 and a supply voltage "V" 220. $R_1$ 210 is connected between $V_{AG}$ 218 and a first node "$N_1$" 222. $R_2$ 212 is connected between $N_1$ 222 and a second node "$N_2$" 224. $R_3$ 214 is connected between $N_2$ 224 and a third node "$N_3$" 226. $R_4$ 216 is connected between $N_3$ 226 and V 220. In this configuration, the voltage at $N_1$ 222 is equal to V/4, the voltage at $N_2$ 224 is equal to V/2, and the voltage at $N_3$ 226 is equal to 3V/4.

The inverting terminals of comparators A 202, B 204, and C 206 are connected to, respectively, $N_1$ 222, $N_2$ 224, and $N_3$ 226. An analog signal "x" 228 is received at an input 230, which is connected to the noninverting terminals of comparators A 202, B 204, and C 206. A quantized signal is produced at the output terminal of each comparator. Quantized signals "$w_1$" 232, "$w_2$" 234, and "$w_3$" 236 are produced at the output terminals of, respectively, comparators A 202, B 204, and C 206. Each quantized signal has a voltage with a value "LOW" or a value "HIGH" depending upon whether a corresponding value of the voltage of analog signal x 228 is less than (or equal to) or greater than the voltage at the inverting terminal of the corresponding comparator (i.e., the reference voltage of the comparator). For example, when the value of the voltage of analog signal x 228 is less than or equal to V/4, the values of the voltages of $W_3$ 236, $w_2$ 234, and $w_1$ 232 are equal to, respectively, LOW, LOW, and LOW. When the value of the voltage of analog signal x 228 is less than or equal to V/2, but greater than V/4, the values of the voltages of $W_3$ 236, $w_2$ 234, and $w_1$ 232 are equal to, respectively, LOW, LOW, and HIGH. When the value of the voltage of analog signal x 228 is less than or equal to 3V/4, but greater than V/2, the values of the voltages of $W_3$ 236, $w_2$ 234, and $w_1$ 232 are equal to, respectively, LOW, HIGH, and HIGH. When the value of the voltage of analog signal x 228 is less than or equal to V, but greater than 3V/4, the values of the voltages of $W_3$ 236, $w_2$ 234, and $w_1$ 232 are equal to, respectively, HIGH, HIGH, and HIGH. It is because quantized signals $w_1$ 232, $w_2$ 234, and $W_3$ 236 are produced simultaneously that two-bit flash ADC 200, also referred to as a "parallel-comparator" ADC, is capable of supporting large bandwidths for rapid transfers of data.

The output terminals of comparators A 202, B 204, and C 206 are connected to priority encoder 208. Quantized signals $w_1$ 232, $w_2$ 234, and $W_3$ 236 are received by priority encoder 208, which processes them to produce, at an output 238, a two-bit digital signal "y" comprising a least significant bit (LSB) signal "$y_1$" 240 and a most significant bit (MSB) signal "$y_2$" 242. FIG. 2B is a truth table 244 for priority encoder 208. In truth table 244, LOW and HIGH are encoded as, respectively, 0 and 1. When quantized signals $W_3$ 236, $w_2$ 234, and $w_1$ 232 are equal to, respectively, 0, 0, and 0, bit signals $y_2$ 242 and $y_1$ 240 are equal to, respectively, 0 and 0, which corresponds to binary number 0. When quantized signals $W_3$ 236, $w_2$ 234, and $w_1$ 232 are equal to, respectively, 0, 0, and 1, bit signals $y_2$ 242 and $y_1$ 240 are equal to, respectively, 0 and 1, which corresponds to binary number 1. When quantized signals $W_3$ 236, $w_2$ 234, and $w_1$ 232 are equal to, respectively, 0, 1, and 1, bit signals $y_2$ 242 and $y_1$ 240 are equal to, respectively, 1 and 0, which corresponds to binary number 2. When quantized signals $W_3$ 236, $w_2$ 234, and $w_1$ 232 are equal to, respectively, 1, 1, and 1, bit signals $y_2$ 242 and $y_1$ 240 are equal to, respectively, 1 and 1, which corresponds to binary number 3.

The skilled artisan will appreciate that, with additional comparators and resistors and by using a priority encoder capable of processing additional quantized signals, flash ADC 200 can be modified so that digital signal y comprises more than two bit signals. Alternatively, flash ADC 200 can be modified so that digital signal y comprises one bit signal.

Implementations of comparators A 202, B 204, and C 206 often use latch circuits, and are referred to as latch comparators. FIG. 3 is a schematic diagram of an exemplary conventional latch circuit 300 that can be used in an implementation of any of comparators A 202, B 204, or C 206. Latch circuit 300 comprises a bistable pair 302 connected between a reset switch 304 and analog ground $V_{AG}$ 218. (Alternatively, analog ground $V_{AG}$ 218 can be replaced by a first supply voltage "$V_{SS}$".) Preferably, bistable pair 302 comprises a first NMOSFET (n-channel Metal Oxide Semiconductor Field Effect Transistor) "M₁" 306 and a second NMOSFET "M₂" 308. Ideally, $M_1$ 306 and $M_2$ 308 are matched transistors. Preferably, each of $M_1$ 306 and $M_2$ 308 has a gain greater than one. However, bistable pair 302 can function if the product of the individual gains of $M_1$ 306 and $M_2$ 308 (i.e., the loop gain) is greater than one. The gate terminal of $M_2$ 308 is connected to the drain terminal of $M_1$ 306 at a first port "$N_4$" 310. The gate terminal of $M_1$ 306 is connected to the drain terminal of $M_2$ 308 at a second port "$N_5$" 312. The source terminals of $M_1$ 306 and $M_2$ 308 are together connected to analog ground $V_{AG}$ 218. In this configuration, $M_1$ 306 and $M_2$ 308 are said to be cross connected. Preferably, reset switch 304 comprises a third NMOSFET "$M_3$" 314. The source terminal of $M_3$ 314 is connected to the drain terminal of one of $M_1$ 306 or $M_2$ 308; the drain terminal of $M_3$ 314 is connected the drain terminal of the other of $M_1$ 306 or $M_2$ 308. A clock waveform "Ck" 316 is applied to the gate terminal of $M_3$ 314. Ck 316 cycles between an "UP" voltage and an "DOWN" voltage at a sampling frequency.

The skilled artisan will appreciate that $M_1$ 306, $M_2$ 308, and $M_3$ 314 can also be realized in other field effect, junction, or combination transistor technologies. In general, reset switch 304 can be realized in a variety of switch technologies, including microelectromechanical embodiments. Latch circuit 300 can also be used for other applications.

For each latch circuit 300 in ADC 200, quantized signal "w" (e.g., $w_1$ 232, $w_2$ 234, or $w_3$ 236) is produced as an output voltage at $N_4$ 310 or $N_5$ 312. Latch circuit 300 is often preceded by an input stage (not shown) that includes a differential amplifier so that the voltage of analog signal x 228, applied at the noninverting terminal of the comparator, can be compared with the voltage at the inverting terminal of the comparator. For example, the voltage of analog signal x 228 is compared with V/4, for comparator A 202; V/2, for comparator B 204; and 3V/4, for comparator C 206.

The input stage produces a differential current signal comprising a first current signal "$i_1$" 318 and a second current signal "$i_2$" 320. First and second current signals $i_1$ 318 and $i_2$ 320 each comprise a bias current "$i_b$" and a signal current "$i_s$". The relationship between bias current $i_b$ and signal current $i_s$ in first current signal $i_1$ 318 can be expressed as shown in Eq. (1):

$$i_1 = i_b + (½)(i_s), \quad \text{Eq. (1)}$$

while the relationship between bias current $i_b$ and signal current $i_s$ in second current signal $i_2$ 320 can be expressed as shown in Eq. (2):

$$i_2 = i_b - (½)(i_s). \quad \text{Eq. (2)}$$

The differential amplifier is configured so that first current signal $i_1$ 318 increases and decreases in response to, respectively, the rise and drop of the voltage of analog signal x 228, while second current signal $i_2$ 320 increases and decreases in response to, respectively, the drop and rise of the voltage of analog signal x 228. Thus, first and second current signals $i_1$ 318 and $i_2$ 320 always change currents in opposite directions, but the sum of first and second current signals $i_1$ 318 and $i_2$ 320 remains constant. In latch circuit 300, first current signal $i_1$ 318 and second current signal $i_2$ 320 are received as input current signals at, respectively, $N_4$ 310 and $N_5$ 312.

In latch circuit 300, when the voltage of Ck 316 is UP (i.e., the reset phase), $M_3$ 314 connects $N_4$ 310 with $N_5$ 312, so that the steady state voltages at both nodes are equal, and bias current $i_b$ flows through each of $M_1$ 306 and $M_2$ 308. Parasitic capacitances at each of nodes $N_4$ 310 and $N_5$ 312 are charged by bias current $i_b$ that flows through each of $M_1$ 306 and $M_2$ 308. The skilled artisan will appreciate that the parasitic capacitance at, for example, $N_4$ 310, includes the gate-to-source capacitance of $M_2$ 308, the drain-to-substrate capacitance of $M_1$ 306, the drain-to-substrate capacitance of $M_3$ 314, and the capacitance of the wiring connecting circuit devices. Bias current $i_b$ charges the parasitic capacitances at each of nodes $N_4$ 310 and $N_5$ 312 so that the voltages at $N_4$ 310 and $N_5$ 312 are at a "MID" value that is between LOW and HIGH. The gate and drain terminals of $M_1$ 306 and $M_2$ 308 are connected together. $M_1$ 306 and $M_2$ 308 are sized so that, under these conditions, they operate in "ON" states.

When the voltage of Ck 316 is DOWN (i.e., the sampling phase), the states of $M_1$ 306 and $M_2$ 308 are controlled by first and second current signals $i_1$ 318 and $i_2$ 320. For example, when first current signal $i_1$ 318 is greater than bias current $i_b$ and second current signal $i_2$ 320 is less than bias current $i_b$, a transient is initiated to force $M_1$ 306 to operate in an "OFF" state, while $M_2$ 308 remains operating in an ON state. The course of this transient depends on how first and second current signals $i_1$ 318 and $i_2$ 320 change during the sampling phase. However, if $M_1$ 306 is turned OFF and the parasitic capacitances at $N_4$ 310 are fully charged by first current signal $i_1$ 318 (i.e., at a new steady state), the voltage at $N_4$ 310 is HIGH and the voltage at $N_5$ 312 is LOW. The transient can be explained in two parts. The first part describes the changes that occur while $M_1$ 306 remains ON. The second part depicts the conclusion of the excursion after $M_1$ 306 is turned OFF.

When first current signal $i_1$ 318 is greater than bias current $i_b$, first current signal $i_1$ 318 continues to charge the parasitic capacitances at $N_4$ 310, which causes the voltage at $N_4$ 310 to rise. This is indicated by a small up-arrow "a" 322. Contemporaneously, when second current signal $i_2$ 320 is less than bias current $i_b$, the parasitic capacitances at $N_5$ 312 start to discharge, which causes the voltage at $N_5$ 312 to drop. This is indicated by a small down-arrow "b" 324.

Because the voltage at $N_4$ 310 is also the voltage at the gate terminal of $M_2$ 308, the voltage at the gate terminal of $M_2$ 308 rises by the same amount as the rise in the voltage at $N_4$ 310. This is indicated by a small up-arrow "c" 326, where small up-arrow c 326 has the same length (i.e., the same change in voltage) as small up-arrow a 322. Because the voltage at the source terminal of $M_2$ 308 is held at analog ground $V_{AG}$ 218, the gate-to-source voltage of $M_2$ 308 increases by the same amount as the rise in the voltage at the gate terminal of $M_2$ 308. The increase in the gate-to-source voltage of $M_2$ 308 causes its drain current to increase. In response to the increase in the gate-to-source voltage of $M_2$ 308 and the increase in its drain current, the drain-to-source voltage of $M_2$ 308 decreases by a greater magnitude than the increase in its gate-to-source voltage. This is indicated by a large down-arrow "d" 328, where large down-arrow d 328 has a longer length (i.e., a larger change in voltage) than small up-arrow c 326. Because the voltage at the source terminal of $M_2$ 308 is held at analog ground $V_{AG}$ 218, the voltage at $N_5$ 312 drops by the same amount as the decrease in drain-to-source voltage of $M_2$ 308. Thus, the voltage at $N_5$ 312 drops under the relatively small effect of second current signal $i_2$ 320 being less than bias current $i_b$ (i.e., small down-arrow b324), and the relatively large effect of the decrease in the drain-to-source voltage of $M_2$ 308 (i.e., large down-arrow d 328).

Likewise, because the voltage at $N_5$ 312 is also the voltage at the gate terminal of $M_1$ 306, the voltage at the gate terminal of $M_1$ 306 drops by the same amount as the drop in the voltage at $N_5$ 312. This is indicated by a small down-arrow "e" 330, where small down-arrow e 330 has the same length (i.e., the same change in voltage) as small down-arrow b 324. Because the voltage at the source terminal of $M_1$ 306 is held at analog ground $V_{AG}$ 218, the gate-to-source voltage of $M_1$ 306 decreases by the same amount as the drop in the voltage at the gate terminal of $M_1$ 306. The decrease in the gate-to-source voltage of $M_1$ 306 causes its drain current to decrease. In response to the decrease in the gate-to-source voltage of $M_1$ 306 and the decrease in its drain current, the drain-to-source voltage of $M_1$ 306 increases by a greater magnitude than the decrease in its gate-to-source voltage. This is indicated by a large up-arrow "f" 332, where large up-arrow f 332 has a longer length (i.e., a larger change in voltage) than small down-arrow e 330. Because the voltage at the source terminal of $M_1$ 306 is held at analog ground $V_{AG}$ 218, the voltage at $N_4$ 310 rises by the same amount as the increase in drain-to-source voltage of $M_1$ 306. Thus, the voltage at $N_4$ 310 rises under the relatively small effect of first current signal $i_1$ 318 being greater than bias current $i_b$ (i.e., small up-arrow a 322) and the relatively large effect of the increase in the drain-to-source voltage of $M_1$ 306 (i.e., large up-arrow f 332).

The increasing of the drain-to-source voltage of $M_1$ 306 and the decreasing of the drain-to-source voltage of $M_2$ 308 reinforce each other. The gate-to-source voltage of $M_1$ 306 decreases with the drain-to-source voltage of $M_2$ 308 until $M_1$ 306 is turned OFF.

When $M_1$ 306 is OFF, it does not conduct current. Without drain current, the decreasing of the gate-to-source voltage of $M_1$ 306 no longer effects its drain-to-source voltage. Thus, the voltage at $N_4$ 310 continues to rise solely under the relatively small effect of first current signal $i_1$ 318 being greater than bias current $i_b$ (i.e., small up-arrow a 322) until the parasitic capacitances at $N_4$ 310 are fully charged and the voltage at $N_4$ 310 is HIGH.

However, because the voltage at $N_4$ 310 is also the voltage at the gate terminal of $M_2$ 308, the voltage at the gate terminal of $M_2$ 308 continues to rise. Because $M_2$ 308 remains ON, the increase in its gate-to-source voltage causes the drain current of $M_2$ 308 to increase, which in turn causes its drain-to-source voltage to decrease by a greater magnitude than the increase in the gate-to-source voltage of $M_2$ 308. Thus, the voltage at $N_5$ 312 continues to drop under the relatively small effect of second current signal $i_2$ 320 being less than bias current $i_b$ (i.e., small down-arrow b 324) and the relatively large effect of the decrease in the drain-to-source voltage of $M_2$ 308 (i.e., large down-arrow d 328) until the discharge of the parasitic capacitances at $N_5$ 312 is balanced and the voltage at $N_5$ 312 is LOW.

Therefore, it is a characteristic of latch circuit 300 that the port (i.e., $N_4$ 310 or $N_5$ 312) receiving the current signal (i.e., $i_1$ 318 or $i_2$ 320) that is greater than bias current $i_b$ requires more time to reach its new steady state voltage than the port receiving the current signal that is less than bias current $i_b$. In practical implementations of latch circuit 300, the port receiving the current signal that is greater than bias current $i_b$ can require three to five times as much time to reach its new steady state voltage as that of the port receiving the current signal that is less than bias current $i_b$. This limitation determines the frequency of Ck 316, and ultimately the processing speed of ADC 200.

Furthermore, if first and second current signals $i_1$ 318 and $i_2$ 320 both have values near to that of bias current $i_b$ (i.e., small signal current $i_s$), it is possible that the output voltage (at $N_4$ 310 or $N_5$ 312) may not reach LOW or HIGH before the end of the sampling phase. In this situation, ADC 200 does not produce a digital output. Such a "non-decision" is referred to as a "bit error". Bit errors can adversely effect the performance of a system that uses the digital output of ADC 200. Such systems typically require bit error rates on an order of $10^{-18}$ to $10^{-16}$. Traditionally, bit errors are reduced by cascading latch comparators, where the overall bit error rate of the system is the product of the bit error rate of each cascaded latch comparator. However, this solution delays processing, complicates circuit design, uses additional die area, and consumes more power. Thus, there is a need to decrease the time necessary for the port (i.e., $N_4$ 310 or $N_5$ 312) receiving the current signal (i.e., $i_1$ 318 or $i_2$ 320) that is greater than bias current $i_b$ to reach its new steady state voltage.

BRIEF SUMMARY OF THE INVENTION

The present invention relates to high speed latch comparators. In a latch circuit having a bistable pair of cross connected transistors of a first polarity and a third transistor of a second polarity, a current signal greater than a bias current is received at a latch circuit port, amplified with the third transistor, and applied to the latch circuit port. This decreases the time in which the latch circuit port receiving the current signal greater than the bias current reaches a steady state voltage. Advantageously, the time in which the latch circuit port receiving the current signal less than the bias current reaches a steady state voltage also decreases.

In an embodiment, a latch circuit comprises a bistable pair and a vertical latch. The bistable pair is connected between a reset switch and a first supply voltage. The bistable pair has a first port capable of receiving a first current signal and producing a first output voltage, and a second port capable of receiving a second current signal and producing a second output voltage. The vertical latch is connected between the first supply voltage and a second supply voltage, and connected to the bistable pair. The vertical latch acts to decrease the time necessary for the port receiving the current signal that is greater than bias current $i_b$ to reach its new steady state voltage.

Preferably, the bistable pair comprises a first MOSFET and a second MOSFET such that the gate terminal of the first MOSFET is connected to the drain terminal of the second MOSFET, the gate terminal of the second MOSFET is connected to the drain terminal of said the MOSFET, and the source terminals of the first and the second MOSFETs are connected to the first supply voltage.

Preferably, the vertical latch comprises a first MOSFET current mirror pair connected to the bistable pair, and a second MOSFET current mirror pair connected to the first MOSFET current mirror pair. The first current mirror can comprise a third MOSFET connected to the first MOSFET of the bistable pair. The second current mirror can comprise a fourth MOSFET connected to the third MOSFET. The source terminal of the third MOSFET is connected to the first supply voltage. The drain terminal of the third MOSFET is connected to the gate terminal of the fourth MOSFET. The source terminal of the fourth MOSFET is connected to the second supply voltage. The drain terminal of the fourth MOSFET is connected to the gate terminal of the third MOSFET, the gate terminal of the first MOSFET, and the drain terminal of the second MOSFET.

The first current mirror can further comprise a fifth MOSFET connected to the third MOSFET. The second current mirror can further comprise a sixth MOSFET connected to the fourth MOSFET. The source terminal of the fifth MOSFET is connected to the first supply voltage. The drain terminal of the fifth MOSFET is connected to the drain terminal of the fourth MOSFET. The gate terminal of the fifth MOSFET is connected to the gate terminal of the third MOSFET and the drain terminal of the fifth MOSFET. The source terminal of the sixth MOSFET is connected to the second supply voltage. The drain terminal of the sixth MOSFET is connected to the drain terminal of the third MOSFET. The gate terminal of the sixth MOSFET is connected to the gate terminal of the fourth MOSFET and the drain terminal of the sixth MOSFET.

The present invention further comprises a method for reducing the power consumed by the latch circuit. When the bistable pair and the vertical latch are reset, the third or fourth MOSFET can be held OFF. After resetting, the fourth MOSFET can be held OFF when the second MOSFET changes state from ON to OFF.

In an embodiment, the fourth MOSFET can be held OFF during the reset phase by a vertical latch reset switch connected to the vertical latch. The vertical latch reset switch can comprise a MOSFET connected between the second supply voltage and the vertical latch. During the reset phase, the vertical latch reset switch connects the gate terminal of the fourth MOSFET to the second supply voltage. Preferably, a voltage source is connected between the vertical latch reset switch and the second supply voltage to decrease the time in which the vertical latch reset switch turns OFF, which decreases the time in which the vertical latch can act to decrease the time necessary for the port receiving the current signal that is greater than bias current $i_b$ to reach its new steady state voltage.

In a related embodiment, the latch circuit can further comprise a second vertical latch connected between the first supply voltage and the second supply voltage, and connected to the bistable pair at the second MOSFET of the bistable pair. A second vertical latch reset switch can be connected to the second vertical latch. A second voltage source can be connected between the second vertical latch reset switch and the second supply voltage.

In a further related embodiment, the fourth MOSFET can be held OFF after resetting when the second MOSFET changes state from ON to OFF by a second bistable pair connected to the second supply voltage, the vertical latch, and the second vertical latch. Preferably, the second bistable pair comprises a first MOSFET and a second MOSFET such that the gate terminal of the first MOSFET is connected to the drain terminal of the second MOSFET, the gate terminal of the second MOSFET is connected to the drain terminal of said the MOSFET, and the source terminals of the first and the second MOSFETs are connected to the second supply voltage. The drain terminal of the second MOSFET of the second bistable pair is connected to the gate terminal of the fourth MOSFET of the vertical latch. After resetting, when the second MOSFET changes state from ON to OFF, the second MOSFET of the second bistable pair turns ON and holds the fourth MOSFET OFF.

In yet a further related embodiment, both the third and fourth MOSFETs can be held OFF during the reset phase by replacing the vertical latch reset switch and the second vertical latch reset switch with a third vertical latch reset switch connected to the second bistable pair, the vertical latch, and the second vertical latch. The third vertical latch reset switch can comprise a MOSFET connected between the second bistable pair and the second supply voltage, connected between the vertical latch and the second supply voltage, and connected between the second vertical latch and the second supply voltage. During the reset phase, the third vertical latch reset switch disconnects the fourth MOSFET from the second supply voltage without connecting the third MOSFET to the second supply voltage.

In an alternative embodiment, the third MOSFET can be held OFF during the reset phase by a reset circuit connected to the bistable pair, the vertical latch, and the second vertical latch. The reset circuit can comprise a first MOSFET connected between the bistable pair and the first supply voltage, and a second MOSFET connected between the vertical latch and the first supply voltage. During the reset phase, the second MOSFET of the reset circuit disconnects the third MOSFET from the first supply voltage.

The reset switch can comprise a MOSFET connected between the first port and the second port. A clock voltage is applied to the gate terminal of the MOSFET. The present invention further comprises a method for reducing the clock voltage where the reset switch comprises a reset circuit.

In an embodiment, the reset circuit comprises a first MOSFET, a second MOSFET, and a third MOSFET. The first MOSFET is connected to the first supply voltage. The second MOSFET is connected between the first MOSFET and the first port. The third MOSFET is connected between the first MOSFET and the second port. The clock voltage is applied to the gate terminal of the first MOSFET.

The present invention also includes a comparator comprising an input stage, a latch circuit, and an output stage. The input stage is capable of receiving an analog signal. The latch circuit is connected to the input stage. The latch circuit has a bistable pair and a vertical latch. The output stage is connected to the latch circuit. The output stage is capable of retaining an output of the latch circuit.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 9 shows a flow chart of a method 900 for decreasing the time in which a latch circuit port receiving a current signal greater than a bias current reaches a steady state voltage.

FIG. 18 shows a flow chart of a method 1800 for reducing the power consumed by a latch circuit.

The preferred embodiments of the invention are described with reference to the figures where like reference numbers indicate identical or functionally similar elements. Also in the figures, the left-most digit(s) of each reference number identify the figure in which the reference number is first used.

DETAILED DESCRIPTION OF THE INVENTION

Figure 1:
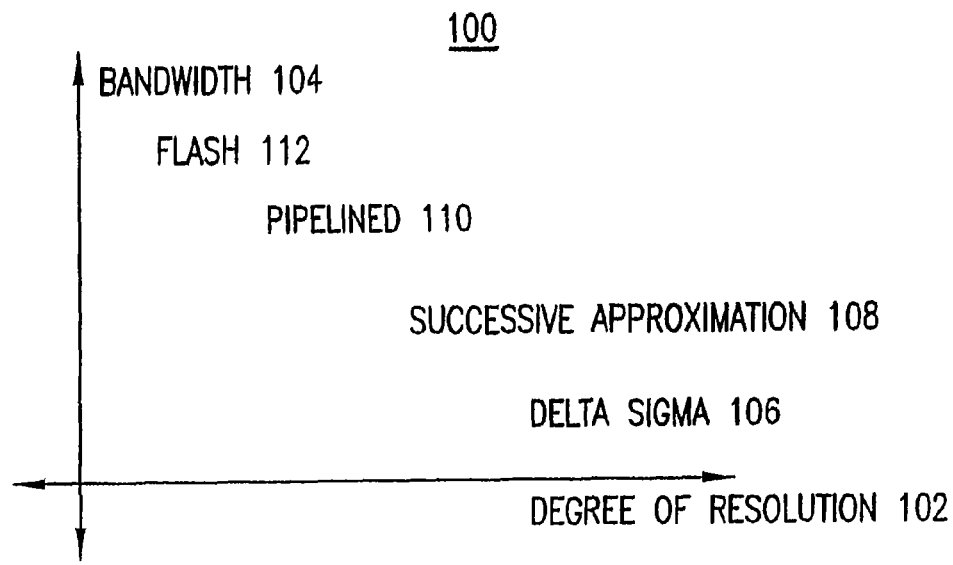
FIG. 1 is a graph 100 that shows the tradeoff between bandwidth and degree of resolution for the various ADC architectures.
Figure 3:
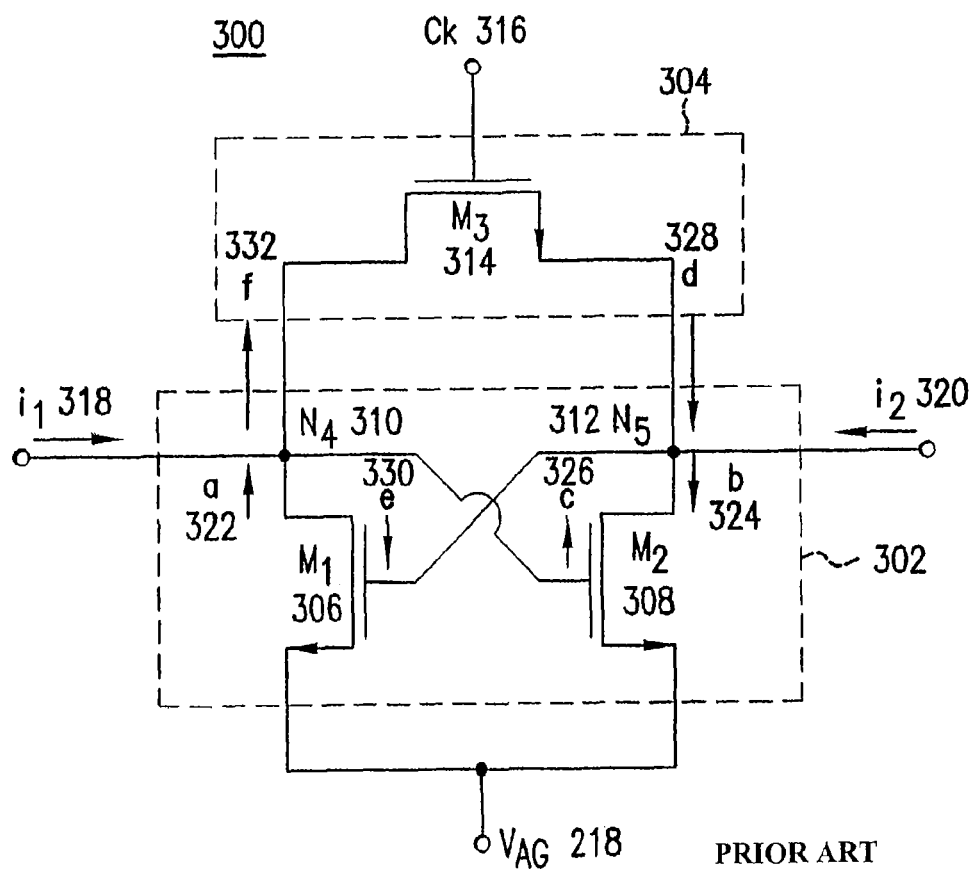
FIG. 3 is a schematic diagram of an exemplary conventional latch circuit 300 that can be used in an implementation of any of comparators A 202, B 204, or C 206.
Figures 2A, 2B:
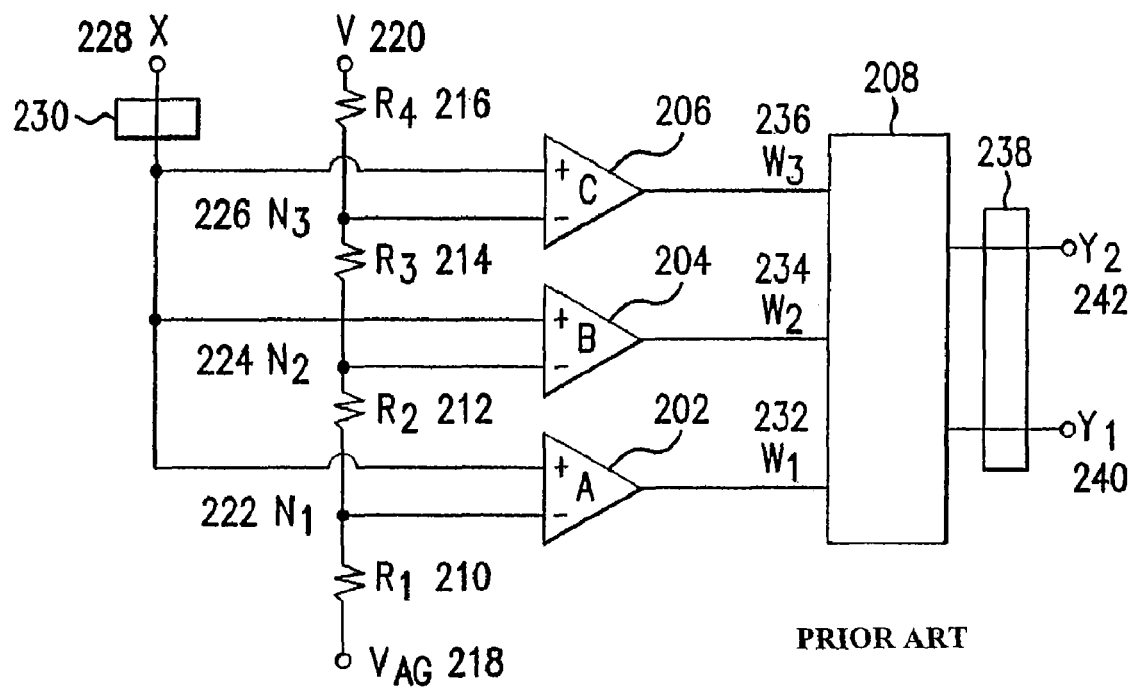
FIG. 2A is a block diagram of an exemplary conventional two-bit flash ADC 200.
FIG. 2B is a truth table 244 for priority encoder 208.
Figure 4:
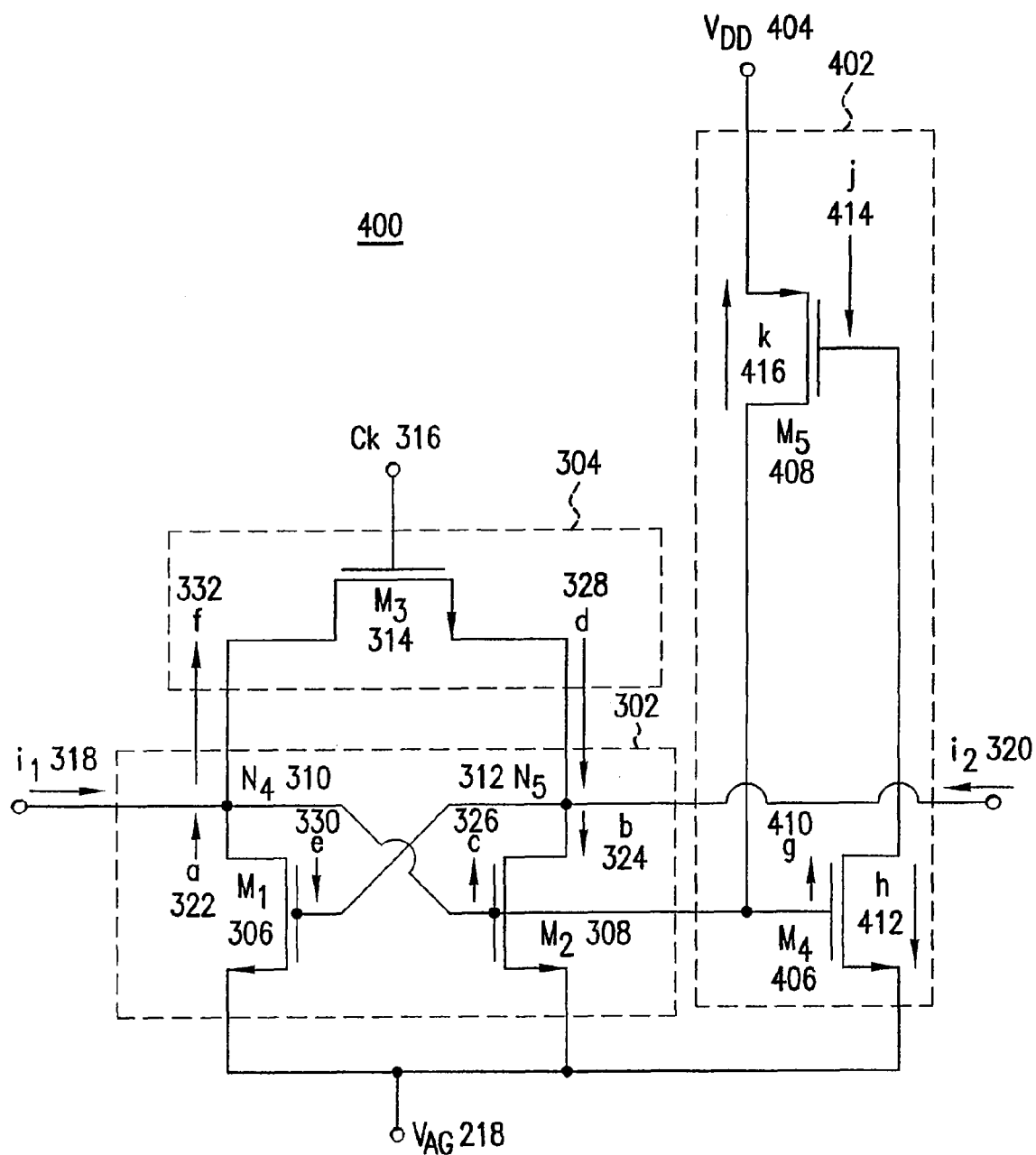
FIG. 4 is a schematic diagram of a latch circuit 400 that explains the present invention.

The present invention relates to high speed latch comparators. FIG. 4 is a schematic diagram of a latch circuit 400 that explains the present invention. Latch circuit 400 comprises bistable pair 302 connected between reset switch 304 and analog ground $V_{AG}$ 218. (Alternatively, analog ground $V_{AG}$ 218 can be replaced by first supply voltage $V_{SS}$.) Preferably, bistable pair 302 comprises first NMOSFET $M_1$ 306 and second NMOSFET $M_2$ 308 connected in the same manner as in latch circuit 300. Ideally, $M_1$ 306 and $M_2$ 308 are matched transistors. Preferably, each of $M_1$ 306 and $M_2$ 308 has a gain greater than one. However, bistable pair 302 can function if the product of the individual gains of $M_1$ 306 and $M_2$ 308 (i.e., the loop gain) is greater than one. Preferably, reset switch 304 comprises third NMOSFET $M_3$ 314. Clock waveform Ck 316 is applied to the gate terminal of $M_3$ 314.

A vertical latch 402 is connected between analog ground $V_{AG}$ 218 and a second supply voltage "$V_{DD}$" 404. Preferably, vertical latch 402 comprises a fourth NMOSFET "$M_4$" 406 and a first PMOSFET (p-channel MOSFET) "$M_5$" 408. Ideally, $M_4$ 406 and $M_5$ 408 are matched transistors. Preferably, each of $M_4$ 406 and $M_5$ 408 has a gain greater than one. However, vertical latch 402 can function if the product of the individual gains of $M_4$ 406 and $M_5$ 408 (i.e., the loop gain) is greater than one. The source terminal of $M_4$ 406 is connected to analog ground $V_{AG}$ 218. The drain terminal of $M_4$ 406 is connected to the gate terminal of $M_5$ 408. The gate terminal of $M_4$ 406 is connected to the gate terminal of $M_2$ 308. The source terminal of $M_5$ 408 is connected to second supply voltage $V_{DD}$ 404. The drain terminal of $M_5$ 408 is connected to the gate terminal of $M_4$ 406. The skilled artisan will appreciate that $M_4$ 406 and $M_5$ 408 can also be realized in other field effect, junction, or combination transistor technologies.

In latch circuit 400, when the voltage of Ck 316 is UP (i.e, the reset phase), $M_3$ 314 connects $N_4$ 310 with $N_5$ 312, so that the steady state voltages at both nodes are equal, and bias current $i_b$ flows through each of $M_1$ 306 and $M_2$ 308. Parasitic capacitances at each of nodes $N_4$ 310 and $N_5$ 312 are charged by bias current $i_b$ that flows through each of $M_1$ 306 and $M_2$ 308. Bias current $i_b$ charges the parasitic capacitances at each of nodes $N_4$ 310 and $N_5$ 312 so that the voltages at $N_4$ 310 and $N_5$ 312 are at MID. The gate and drain terminals of $M_1$ 306 and $M_2$ 308 are connected together. $M_1$ 306 and $M_2$ 308 are sized so that, under these conditions, they are both ON.

When the voltage of Ck 316 is DOWN (i.e., the sampling phase), the states of $M_1$ 306 and $M_2$ 308 are controlled by first and second current signals $i_1$ 318 and $i_2$ 320. For example, when first current signal $i_1$ 318 is greater than bias current $i_b$ and second current signal $i_2$ 320 is less than bias current $i_b$, a transient is initiated to force $M_1$ 306 OFF, while $M_2$ 308 remains ON. The course of this transient depends on how first and second current signals $i_1$ 318 and $i_2$ 320 change during the sampling phase. However, if $M_1$ 306 is turned OFF and the parasitic capacitances at $N_4$ 310 are fully charged by first current signal $i_1$ 318 (i.e., at a new steady state), the voltage at $N_4$ 310 is HIGH and the voltage at $N_5$ 312 is LOW. The transient can be explained in two parts. The first part describes the changes that occur while $M_1$ 306 remains ON. The second part depicts the conclusion of the excursion after $M_1$ 306 is turned OFF.

When first current signal $i_1$ 318 is greater than bias current $i_b$, first current signal $i_1$ 318 continues to charge the parasitic capacitances at $N_4$ 310, which causes the voltage at $N_4$ 310 to rise. This is indicated by small up-arrow a 322. Contemporaneously, when second current signal $i_2$ 320 is less than bias current $i_b$, the parasitic capacitances at $N_5$ 312 start to discharge, which causes the voltage at $N_5$ 312 to drop. This is indicated by small down-arrow b 324.

Because the voltage at $N_5$ 312 is also the voltage at the gate terminal of $M_1$ 306, the voltage at the gate terminal of $M_1$ 306 drops by the same amount as the drop in the voltage at $N_5$ 312. This is indicated by small down-arrow e 330, where small down-arrow e 330 has the same length (i.e., the same change in voltage) as small down-arrow b 324. Because the voltage at the source terminal of $M_1$ 306 is held at analog ground $V_{AG}$ 218, the gate-to-source voltage of $M_1$ 306 decreases by the same amount as the drop in the voltage at the gate terminal of $M_1$ 306. The decrease in the gate-to-source voltage of $M_1$ 306 causes its drain current to decrease. In response to the decrease in the gate-to-source voltage of $M_1$ 306 and the decrease in its drain current, the drain-to-source voltage of $M_1$ 306 increases by a greater magnitude than the decrease in its gate-to-source voltage. This is indicated by large up-arrow f 332, where large up-arrow f 332 has a longer length (i.e., a larger change in voltage) than small down-arrow e 330.

Meanwhile, because the voltage at $N_4$ 310 is also the voltage at the gate terminal of $M_2$ 308, the voltage at the gate terminal of $M_2$ 308 rises by the same amount as the rise in the voltage at $N_4$ 310. This is indicated by small up-arrow c 326, where small up-arrow c 326 has the same length (i.e., the same change in voltage) as small up-arrow a 322. Likewise, because the voltage at $N_4$ 310 is also the voltage at the gate terminal of $M_4$ 406, the voltage at the gate terminal of $M_4$ 406 rises by the same amount as the rise in the voltage at $N_4$ 310. This is indicated by a small up-arrow "g" 410, where small up-arrow g 410 has the same length (i.e., the same change in voltage) as small up-arrow a 322.

Because the voltage at the source terminal of $M_2$ 308 is held at analog ground $V_{AG}$ 218, the gate-to-source voltage of $M_2$ 308 increases by the same amount as the rise in the voltage at the gate terminal of $M_2$ 308. The increase in the gate-to-source voltage of $M_2$ 308 causes its drain current to increase. In response to the increase in the gate-to-source voltage of $M_2$ 308 and the increase in its drain current, the drain-to-source voltage of $M_2$ 308 decreases by a greater magnitude than the increase in its gate-to-source voltage. This is indicated by large down-arrow d 328, where large down-arrow d 328 has a longer length (i.e., a larger change in voltage) than small up-arrow c 326. Likewise, because the voltage at the source terminal of $M_4$ 406 is held at analog ground $V_{AG}$ 218, the gate-to-source voltage of $M_4$ 406 increases by the same amount as the rise in the voltage at the gate terminal of $M_4$ 406. The increase in the gate-to-source voltage of $M_4$ 406 causes its drain current to increase. In response to the increase in the gate-to-source voltage of $M_4$ 406 and the increase in its drain current, the drain-to-source voltage of $M_4$ 406 decreases by a greater magnitude than the increase in its gate-to-source voltage. This is indicated by a large down-arrow "h" 412, where large down-arrow h 412 has a longer length (i.e., a larger change in voltage) than small up-arrow c 326.

Because the voltage at the source terminal of $M_4$ 406 is held at analog ground $V_{AG}$ 218, the decrease in the drain-to-source voltage of $M_4$ 406 causes the voltage at the drain terminal of $M_4$ 406 to drop by the same amount. Because the voltage at the drain terminal of $M_4$ 406 is also the voltage at the gate terminal of $M_5$ 408, the voltage at the gate terminal of $M_5$ 408 drops by the same amount as the drop in the voltage at the drain terminal of $M_4$ 406. This is indicated by a large down-arrow "j" 414, where large down-arrow j 414 has the same length (i.e., the same change in voltage) as large down-arrow h 412. Because the voltage at the source terminal of $M_5$ 408 is held at second supply voltage $V_{DD}$ 404, the drop in the voltage at the gate terminal of $M_5$ 408 (i.e., a PMOSFET) causes its gate-to-source voltage to increase by the same amount. The increase in the gate-to-source voltage of $M_5$ 408 causes its drain current to increase. In response to the increase in the gate-to-source voltage of $M_5$ 408 and the increase in its drain current, the drain-to-source voltage of $M_5$ 408 decreases by a greater magnitude than the increase in its gate-to-source voltage. This is indicated by a larger up-arrow "k" 416, where larger up-arrow k 416 has a longer length (i.e., a larger change in voltage) than large down-arrow j 414.

Because the voltage at the source terminal of $M_2$ 308 is held at analog ground $V_{AG}$ 218, the voltage at $N_5$ 312 drops by the same amount as the decrease in drain-to-source voltage of $M_2$ 308. Thus, the voltage at $N_5$ 312 drops under the relatively small effect of second current signal $i_2$ 320 being less than bias current $i_b$ (i.e., small down-arrow b324), and the relatively large effect of the decrease in the drain-to-source voltage of $M_2$ 308 (i.e., large down-arrow d 328).

Because the voltage at $N_4$ 310 is also the voltage at the drain terminal of $M_5$ 408 and because the voltage at the source terminal of $M_5$ 408 is held at second supply voltage $V_{DD}$ 404, the voltage at $N_4$ 310 rises by the same amount as the decrease in the drain-to-source voltage of $M_5$ 408. Furthermore, because the voltage at the source terminal of $M_1$ 306 is held at analog ground $V_{AG}$ 218, the voltage at $N_4$ 310 rises by the same amount as the increase in drain-to-source voltage of $M_1$ 306. Additionally, because the voltage at the source terminal of $M_5$ 408 is held at second supply voltage $V_{DD}$ 404, the voltage at $N_4$ 310 also rises by the same amount as the decrease in drain-to-source voltage of $M_5$ 408 (i.e., a PMOSFET). Thus, the voltage at $N_4$ 310 rises under the relatively small effect of first current signal $i_1$ 318 being greater than bias current $i_b$ (i.e., small up-arrow a 322), the relatively large effect of the increase in the drain-to-source voltage of $M_1$ 306 (i.e., large up-arrow f 332), and the relatively larger effect of the decrease in the drain-to-source voltage of $M_5$ 408 (i.e., larger up-arrow k 416).

The increasing of the drain-to-source voltage of $M_1$ 306 and the decreasing of the drain-to-source voltage of $M_2$ 308 reinforce each other. The gate-to-source voltage of $M_1$ 306 decreases with the drain-to-source voltage of $M_2$ 308 until $M_1$ 306 is turned OFF.

When $M_1$ 306 is OFF, it does not conduct current. Without drain current, the decreasing of the gate-to-source voltage of $M_1$ 306 no longer effects its drain-to-source voltage. However, the voltage at $N_4$ 310 continues to rise under the relatively small effect of first current signal $i_1$ 318 being greater than bias current $i_b$ (i.e., small up-arrow a 322) and the relatively larger effect of the decrease in the drain-to-source voltage of $M_5$ 408 (i.e., larger up-arrow k 416) until the parasitic capacitances at $N_4$ 310 are fully charged and the voltage at $N_4$ 310 is HIGH.

It will be recognized that $M_4$ 406 and $M_5$ 408 form a positive feedback loop that amplifies first current signal $i_1$ 318 and applies an exponentially growing current to the drain terminal of $M_1$ 306. Thus, the parasitic capacitances at $N_4$ 310 are charged under the combined effects of first current signal $i_1$ 318 and the exponentially growing current drawn from second supply voltage $V_{DD}$ 404 by $M_5$ 408.

Contemporaneously, because the voltage at $N_4$ 310 is also the voltage at the gate terminal of $M_2$ 308, the voltage at the gate terminal of $M_2$ 308 continues to rise. Because $M_2$ 308 remains ON, the increase in its gate-to-source voltage causes the drain current of $M_2$ 308 to increase, which in turn causes its drain-to-source voltage to decrease by a greater magnitude than the increase in the gate-to-source voltage of $M_2$ 308. Thus, the voltage at $N_5$ 312 continues to drop under the relatively small effect of second current signal $i_2$ 320 being less than bias current $i_b$ (i.e., small down-arrow b 324) and the relatively large effect of the decrease in the drain-to-source voltage of $M_2$ 308 (i.e., large up-arrow f 332) until the discharge of the parasitic capacitances at $N_5$ 312 is balanced and the voltage at $N_5$ 312 is LOW.

Thus, vertical latch 402 acts (i.e., larger up-arrow k 416) to decrease the time necessary for the port (i.e., $N_4$ 310) receiving the current signal (i.e., $i_1$ 318) that is greater than bias current $i_b$ to reach its new steady state voltage. Advantageously, the time necessary for the port (i.e., $N_4$ 310) receiving the current signal (i.e., $i_1$ 318) that is less than bias current $i_b$ to reach a steady state voltage also is decreased.

Figure 5:
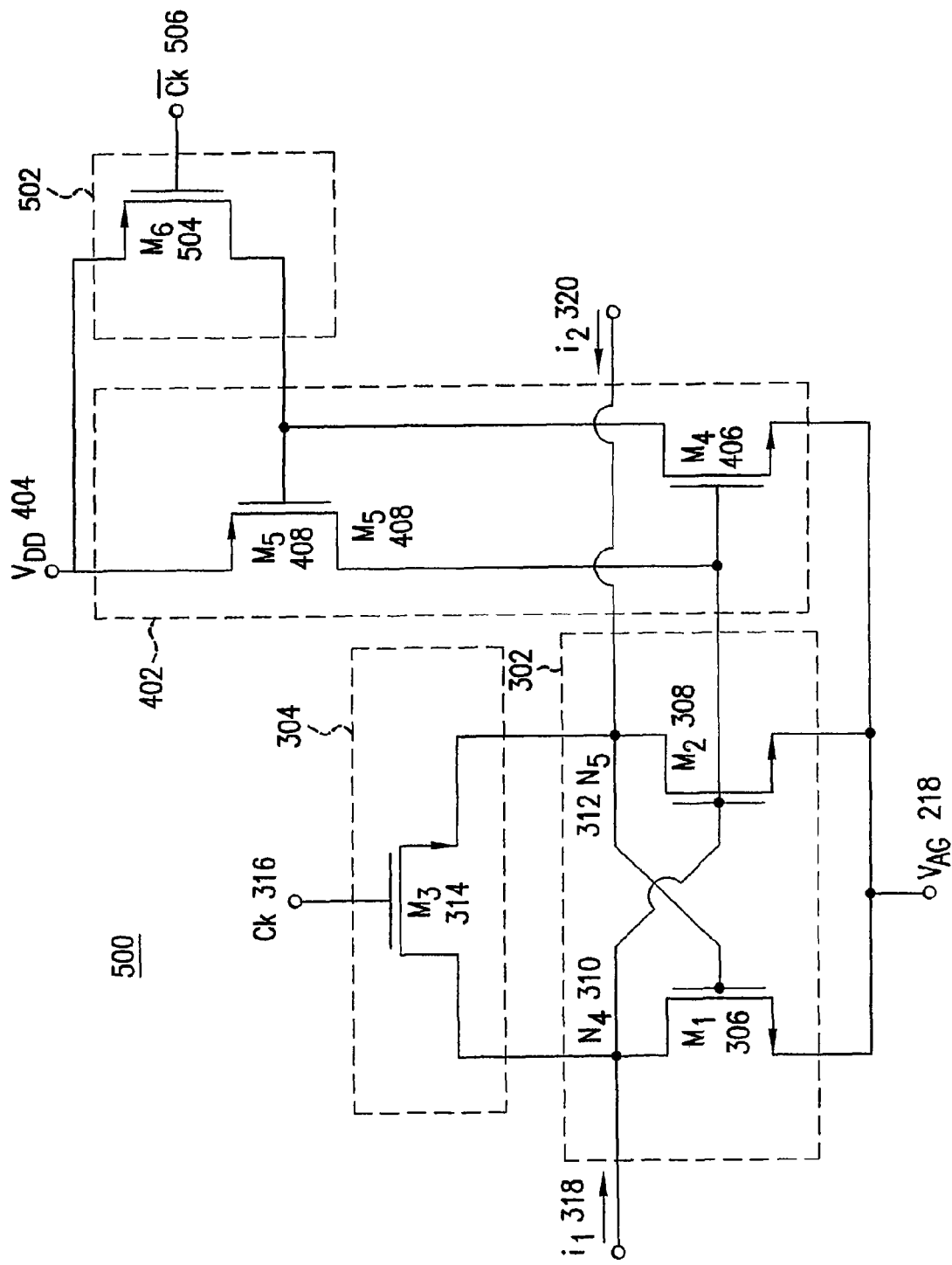
FIG. 5 is a schematic diagram of a latch circuit 500, in which latch circuit 400 further comprises a vertical latch reset switch 502.

FIG. 5 is a schematic diagram of a latch circuit 500, in which latch circuit 400 further comprises a vertical latch reset switch 502. Preferably, vertical latch reset switch 502 comprises a second PMOSFET "$M_6$" 504. The source terminal of $M_6$ 504 is connected to second supply voltage $V_{DD}$ 404. The drain terminal of $M_6$ 504 is connected to the gate terminal of $M_5$ 408. An inverse clock waveform "Ck.bar" 506 is applied to the gate terminal of $M_6$ 504. Ck.bar 506 cycles between DOWN voltage and UP voltage at the sampling frequency in a manner such that when the voltage of Ck 316 is UP, the voltage of Ck.bar 506 is DOWN, and vice versa. The skilled artisan will appreciate that $M_6$ 504 can also be realized in other field effect, junction, or combination transistor technologies. In general, vertical latch reset switch 502 can be realized in a variety of switch technologies, including microelectromechanical embodiments.

When the voltage of Ck.bar 506 is DOWN (i.e., the reset phase), $M_6$ 504 connects the gate terminal of $M_5$ 408 to second supply voltage $V_{DD}$ 404. With the gate and source terminals of $M_5$ 408 connected together, the gate-to-source voltage of $M_5$ 408 is made to equal zero, holding $M_5$ 408 OFF. This disrupts the latching action of vertical latch 402 so that bistable pair 302 can assume a state independent of the state of vertical latch 402.

When the voltage of Ck.bar 506 is DOWN, the voltage of Ck 316 is UP. When the voltage of Ck 316 is UP, $M_3$ 314 connects $N_4$ 310 and $N_5$ 312, so that the steady state voltages at both nodes are equal. Latch circuit 500 is configured so that the voltage at $N_4$ 310 equals the voltage at the drain terminal of $M_5$ 408. Because vertical latch reset switch 502 holds $M_5$ 408 OFF, it does not act to effect the state of bistable pair 302. Thus, with the gate and drain terminals of $M_1$ 306 and $M_2$ 308 connected together, latch circuit 500 is configured so that both $M_1$ 306 and $M_2$ 308 are ON. Because the gate-to-source voltage of $M_2$ 308 is also the gate-to-source voltage of $M_4$ 406, and $M_6$ 504 connects the drain terminal of $M_4$ 406 to second supply voltage $V_{DD}$ 404 such that the drain-to-source voltage of $M_6$ 504 is larger than that of $M_2$ 308, $M_4$ 406 is also ON.

Thus, by holding $M_5$ 408 OFF, vertical latch reset switch 502 reduces the power consumed by vertical latch 402 during the reset phase.

Figure 6:
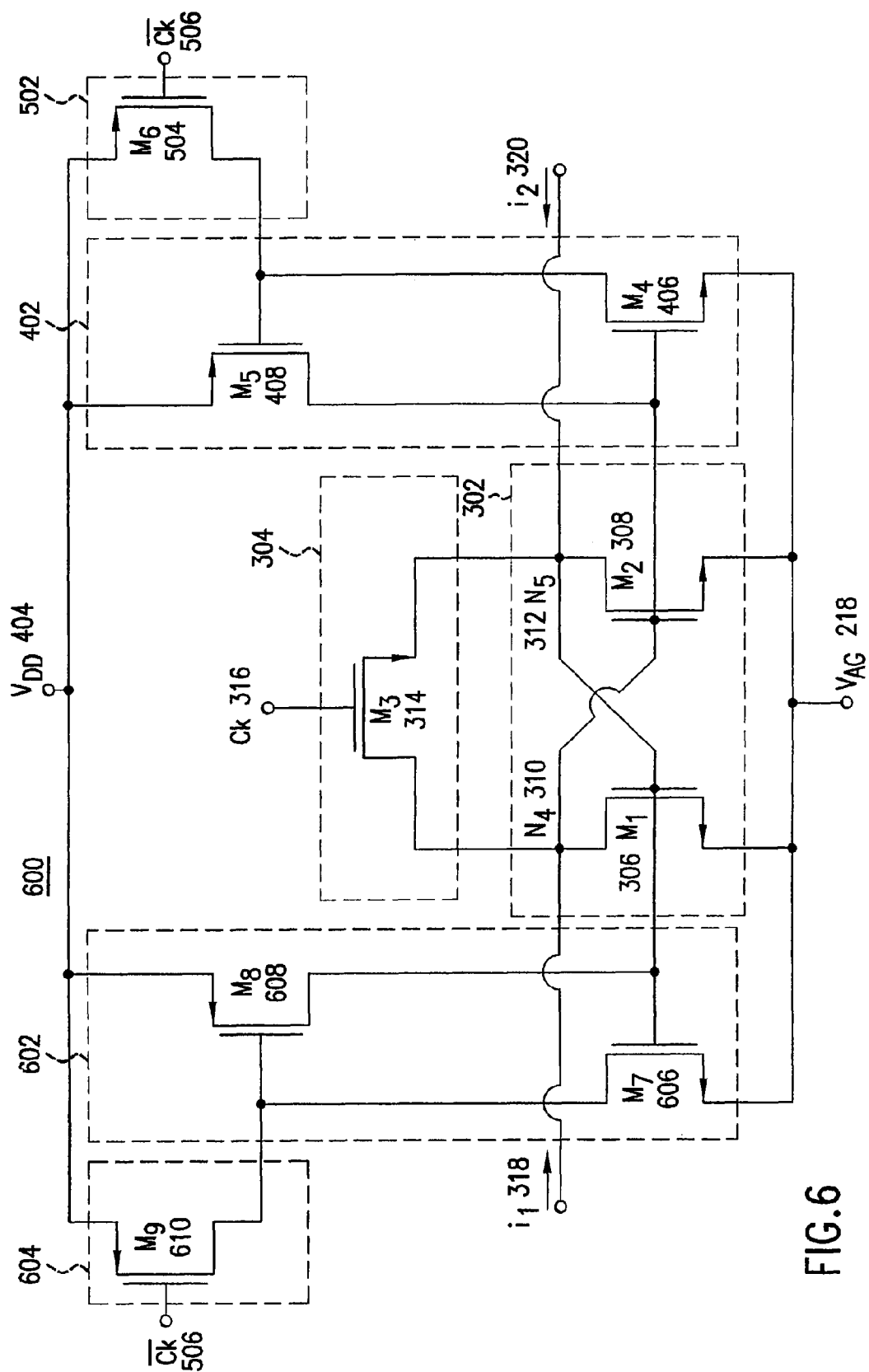
FIG. 6 is a schematic diagram of a latch circuit 600, in which latch circuit 500 further comprises a second vertical latch 602 and a second vertical latch reset switch 604.

FIG. 6 is a schematic diagram of a latch circuit 600, in which latch circuit 500 further comprises a second vertical latch 602 and a second vertical latch reset switch 604. Second vertical latch 602 is connected between analog ground $V_{AG}$ 218 and second supply voltage $V_{DD}$ 404. Preferably, second vertical latch 602 comprises a fifth NMOSFET "$M_7$" 606 and a third PMOSFET "$M_8$" 608. Ideally, $M_7$ 606 and $M_8$ 608 are matched transistors. Preferably, each of $M_7$ 606 and $M_8$ 608 has a gain greater than one. However, second vertical latch 602 can function if the product of the individual gains of $M_7$ 606 and $M_8$ 608 (i.e., the loop gain) is greater than one. The source terminal of $M_7$ 606 is connected to analog ground $V_{AG}$ 218. The drain terminal of $M_7$ 606 is connected to the gate terminal of $M_8$ 608. The gate terminal of $M_7$ 606 is connected to the gate terminal of $M_1$ 306. The source terminal of $M_8$ 608 is connected to second supply voltage $V_{DD}$ 404. The drain terminal of $M_8$ 608 is connected to the gate terminal of $M_7$ 606. Preferably, second vertical latch reset switch 604 comprises a fourth PMOSFET "$M_9$" 610. The source terminal of $M_9$ 610 is connected to second supply voltage $V_{DD}$ 404. The drain terminal of $M_9$ 610 is connected to the gate terminal of $M_8$ 608. Inverse clock waveform Ck.bar 506 is applied to the gate terminal of $M_9$ 610. The skilled artisan will appreciate that $M_7$ 606, $M_8$ 608, and $M_9$ 610 can also be realized in other field effect, junction, or combination transistor technologies. In general, second vertical latch reset switch 604 can be realized in a variety of switch technologies, including microelectromechanical embodiments.

Second vertical latch 602 and second vertical latch reset switch 604 operate in the same manner as vertical latch 402 and vertical latch reset switch 502. Whereas vertical latch reset switch 502 disrupts the latching action of vertical latch 402, second vertical latch reset switch 604 disrupts the latching action of second vertical latch 602. Likewise, while vertical latch 402 acts to decrease the time necessary for the port (i.e., $N_4$ 310) receiving the current signal (i.e., $i_1$ 318) that is greater than bias current $i_b$ to reach its new steady state voltage, second vertical latch 602 also acts to decrease the time necessary for the port (i.e., $N_5$ 312) receiving the current signal (i.e., $i_2$ 320) that is greater than bias current $i_b$ to reach its new steady state voltage. Because the time in which either port (i.e., $N_4$ 310 or $N_5$ 312) receiving the current signal (i.e., $i_1$ 318 or $i_2$ 320) that is greater than bias current $i_b$ reaches its new steady state voltage is decreased, latch circuit 600 is faster than latch circuit 300. This enables the frequency of Ck 316 (and Ck.bar 506) to be increased, which increases the processing speed of an ADC that incorporates latch circuit 600. Alternatively, where Ck 316 (and Ck.bar 506) is maintained at its original frequency, the bit error rate of a system that uses an ADC that incorporates latch circuit 600 can be improved.

Figure 7:
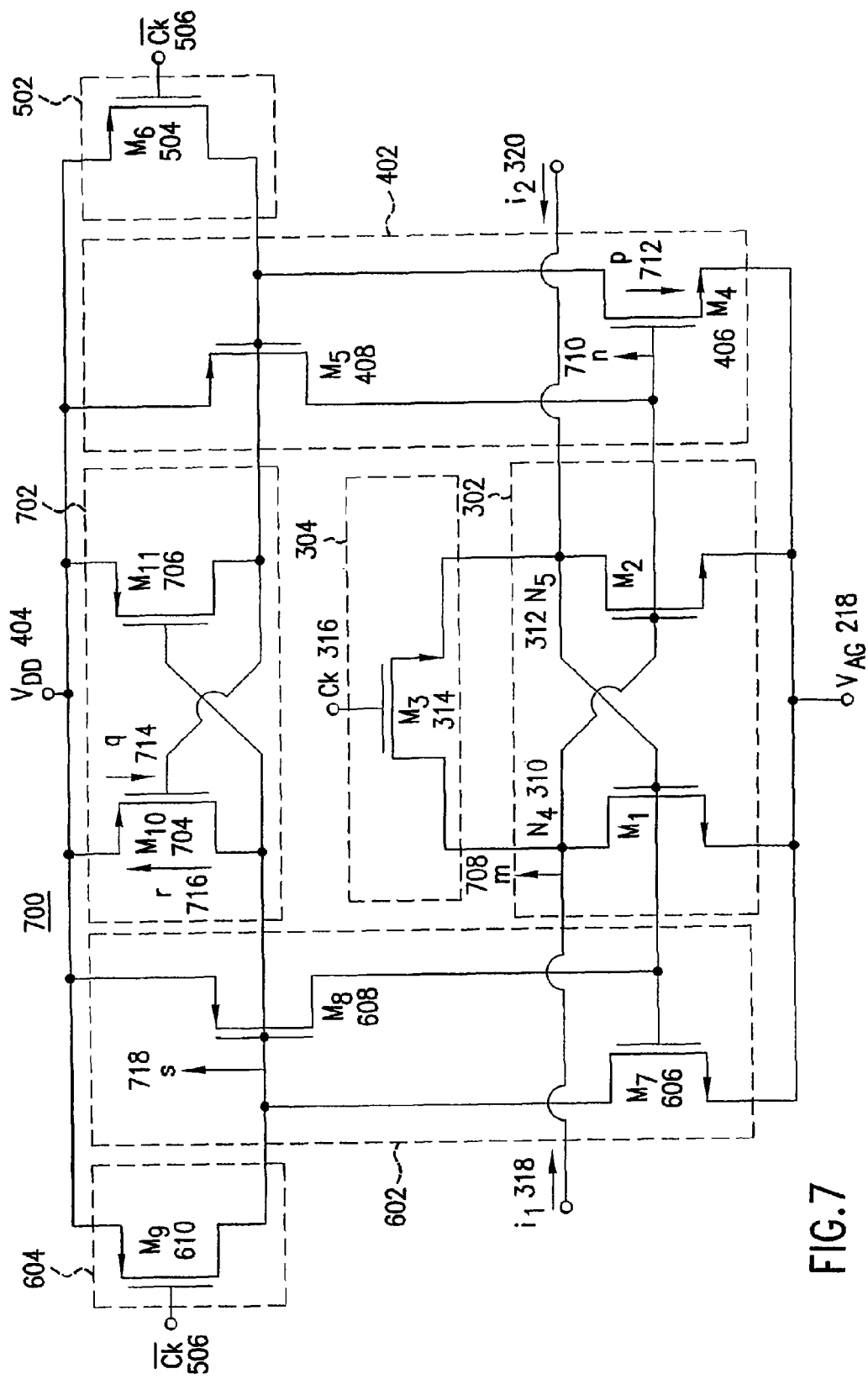
FIG. 7 is a schematic diagram of a latch circuit 700, in which latch circuit 600 further comprises a second bistable pair 702.

FIG. 7 is a schematic diagram of a latch circuit 700, in which latch circuit 600 further comprises a second bistable pair 702. Preferably, second bistable pair 702 comprises a fifth PMOSFET "$M_{10}$" 704 and a sixth PMOSFET "$M_{11}$" 706. Ideally, $M_{10}$ 704 and $M_{11}$ 706 are matched transistors. Preferably, each of $M_{10}$ 704 and $M_{11}$ 706 has a gain greater than one. However, second bistable pair 702 can function if the product of the individual gains of $M_7$ 606 and $M_8$ 608 (i.e., the loop gain) is greater than one. The gate terminal of $M_{11}$ 706 is connected to the drain terminal of $M_{10}$ 704 and to the gate terminal of $M_8$ 608. The gate terminal of $M_{10}$ 704 is connected to the drain terminal of $M_{11}$ 706 and to the gate terminal of $M_5$ 408. The source terminals of $M_{10}$ 704 and $M_{11}$ 706 are together connected to second supply voltage $V_{DD}$ 404. The skilled artisan will appreciate that $M_{10}$ 704 and $M_{11}$ 706 can also be realized in other field effect, junction, or combination transistor technologies.

When the voltage of Ck.bar 506 is DOWN (i.e., the reset phase), $M_6$ 504 and $M_9$ 610 connect the gate and drain terminals of $M_{10}$ 704 and $M_{11}$ 706 together to second supply voltage $V_{DD}$ 404. With the gate and source terminals of $M_{10}$ 704 and $M_{11}$ 706 both connected to second supply voltage $V_{DD}$ 404, the gate-to-source voltages of $M_{10}$ 704 and $M_{11}$ 706 are made to equal zero, holding $M_{10}$ 704 and $M_{11}$ 706 OFF.

When the voltage of Ck.bar 506 is UP (i.e. the sampling phase), the states of $M_1$ 306, $M_2$ 308, $M_{10}$ 704, and $M_{11}$ 706 are controlled by first and second current signals $i_1$ 318 and $i_2$ 320. However, in the situation in which first and second current signals $i_1$ 318 and $i_2$ 320 both have values near to that of bias current $i_b$ (i.e., small signal current $i_1$), there can be a significant delay before first and second current signals $i_1$ 318 and $i_2$ 320 act to force one MOSFET (e.g., $M_1$ 306) OFF while the other MOSFET (e.g., $M_2$ 308) remains ON. Contemporaneously, with $M_4$ 406 and $M_7$ 606 both ON at the start of the sampling phase, the gate-to-source voltages of $M_5$ 408 and $M_8$ 608 (i.e., PMOSFETs) can drift to values greater than their threshold voltages such that $M_5$ 408 and $M_8$ 608 turn ON. Having $M_1$ 308, $M_2$ 310, $M_4$ 406, $M_5$ 408, $M_7$ 606, and $M_8$ 608 all ON before the MOSFETs change states can cause latch circuit 700 to draw a large amount of current. Latch circuit 700 acts, in response to first and second current signals $i_1$ 318 and $i_2$ 320, to force one MOSFET of second bistable pair 702 (e.g., $M_{10}$ 704) ON while the other MOSFET of second bistable pair 702 (e.g., $M_{11}$ 706) remains OFF. The MOSFET of second bistable pair 702 (e.g., $M_{10}$ 704) that turns ON connects the gate terminal of its corresponding vertical latch MOSFET (e.g., $M_5$ 408) to second supply voltage $V_{DD}$ 404. With the gate and source terminals of the corresponding vertical latch MOSFET connected together, the gate-to-source voltage of the corresponding vertical latch MOSFET is made to equal zero, holding the corresponding vertical latch MOSFET OFF. In this manner, second bistable pair 702 acts to prevent latch circuit 700 from drawing unnecessary current before the MOSFETs change states during the sampling phase. Thus, for comparable realizations of latch circuits 600 and 700, latch circuit 700 consumes less power.

For example, when, at the start of the sampling phase, first current signal $i_1$ 318 is slightly larger than bias current $i_b$ (i.e., small positive signal current is), then first current signal $i_1$ 318 slowly continues to charge the parasitic capacitances at $N_4$ 310, which causes the voltage at $N_4$ 310 to rise slightly. This is indicated by a very small up-arrow "m" 708. Because the voltage at $N_4$ 310 is also the voltage at the gate terminal of $M_4$ 406, the voltage at the gate terminal of $M_4$ 406 rises by the same amount as the rise in the voltage at $N_4$ 310. This is indicated by a very small up-arrow "n" 710, where very small up-arrow n 710 has the same length (i.e., the same change in voltage) as very small up-arrow m 708.

Because the voltage at the source terminal of $M_4$ 406 is held at analog ground $V_{AG}$ 218, the gate-to-source voltage of $M_4$ 406 increases by the same amount as the rise in the voltage at the gate terminal of $M_4$ 406. The increase in the gate-to-source voltage of $M_4$ 406 causes its drain current to increase. In response to the increase in the gate-to-source voltage of $M_4$ 406 and the increase in its drain current, the drain-to-source voltage of $M_4$ 406 decreases by a greater magnitude than the increase in its gate-to-source voltage. This is indicated by a small down-arrow "p" 712, where small down-arrow p 712 has a longer length (i.e., a larger change in voltage) than very small up-arrow n 710. Because the voltage at the source terminal of $M_4$ 406 is held at analog ground $V_{AG}$ 218, the decrease in the drain-to-source voltage of $M_4$ 406 causes the voltage at the drain terminal of $M_4$ 406 to drop by the same amount.

Because the voltage at the drain terminal of $M_4$ 406 is also the voltage at the gate terminal of $M_{10}$ 704, the voltage at the gate terminal of $M_{10}$ 704 drops by the same amount as the drop in the voltage at the drain terminal of $M_4$ 406. This is indicated by a small down-arrow "q" 714, where small down-arrow q 714 has the same length (i.e., the same change in voltage) as small down-arrow p 712.

Because the voltage at the source terminal of $M_{10}$ 704 is held at second supply voltage $V_{DD}$ 404, the drop in the voltage at the gate terminal of $M_1$ 704 (i.e., a PMOSFET) causes its gate-to-source voltage to increase by the same amount. The increase in the gate-to-source voltage of $M_{10}$ 704 causes its drain current to increase. In response to the increase in the gate-to-source voltage of $M_{10}$ 704 and the increase in its drain current, the drain-to-source voltage of $M_{10}$ 704 decreases by a greater magnitude than the decrease in its gate-to-source voltage. This is indicated by a large up-arrow "r" 716, where large up-arrow r 716 has a greater length (i.e., a larger change in voltage) than small down arrow q 714. Because the voltage at the source terminal of $M_{10}$ 704 is held at second supply voltage $V_{DD}$ 404, the decrease in the drain-to-source voltage of $M_{10}$ 704 (i.e., a PMOSFET) causes the voltage at the drain terminal of $M_{10}$ 704 to rise by the same amount.

Because the voltage at the drain terminal of $M_{10}$ 704 is also the voltage at the gate terminal of Mg 608, the voltage at the gate terminal of Mg 608 rises by the same amount as the rise in the voltage at the drain terminal of $M_{10}$ 704. This is indicated by a large up-arrow "s" 718, where large up-arrow s 718 has the same length (i.e., the same change in voltage) as large up-arrow r 716. Because the voltage at the source terminal of $M_8$ 608 is held at second supply voltage $V_{DD}$ 404, the rise in the voltage at the gate terminal of Mg 608 (i.e. a PMOSFET) causes its gate-to-source voltage to decrease by the same amount.

The decrease in the gate-to-source voltage of Mg 608 ensures that it is less than its threshold voltage so that Mg 608 is held OFF. Having $M_8$ 608 held OFF until first current signal $i_1$ 318 charges the parasitic capacitances at $N_4$ 310 to its new steady state voltage of HIGH prevents latch circuit 700 from drawing unnecessary current during the sampling phase.

Likewise, it can be demonstrated that when, at the start of the sampling phase, second current signal $i_2$ 320 is slightly larger than bias current $i_b$ (i.e., small negative signal current $i_s$), then second current signal $i_2$ 320 causes $M_{11}$ 706 to turn ON so that $M_5$ 408 is held OFF. Having $M_5$ 408 held OFF until second current signal $i_2$ 320 charges the parasitic capacitances at $N_5$ 312 to its new steady state voltage of HIGH prevents latch circuit 700 from drawing unnecessary current during the sampling phase.

Simulations of an implementation that uses an ADC that incorporates latch circuit 700, in which parameters that define latch circuit 700 (i.e., supply voltages, clock frequency, etc.) had specific values, showed latch circuit 700 to be capable of a five-fold increase in speed, or alternatively capable of reducing bit error rate from $10^{-10}$ to between $10^{-80}$ and $10^{-50}$.

Figure 8:
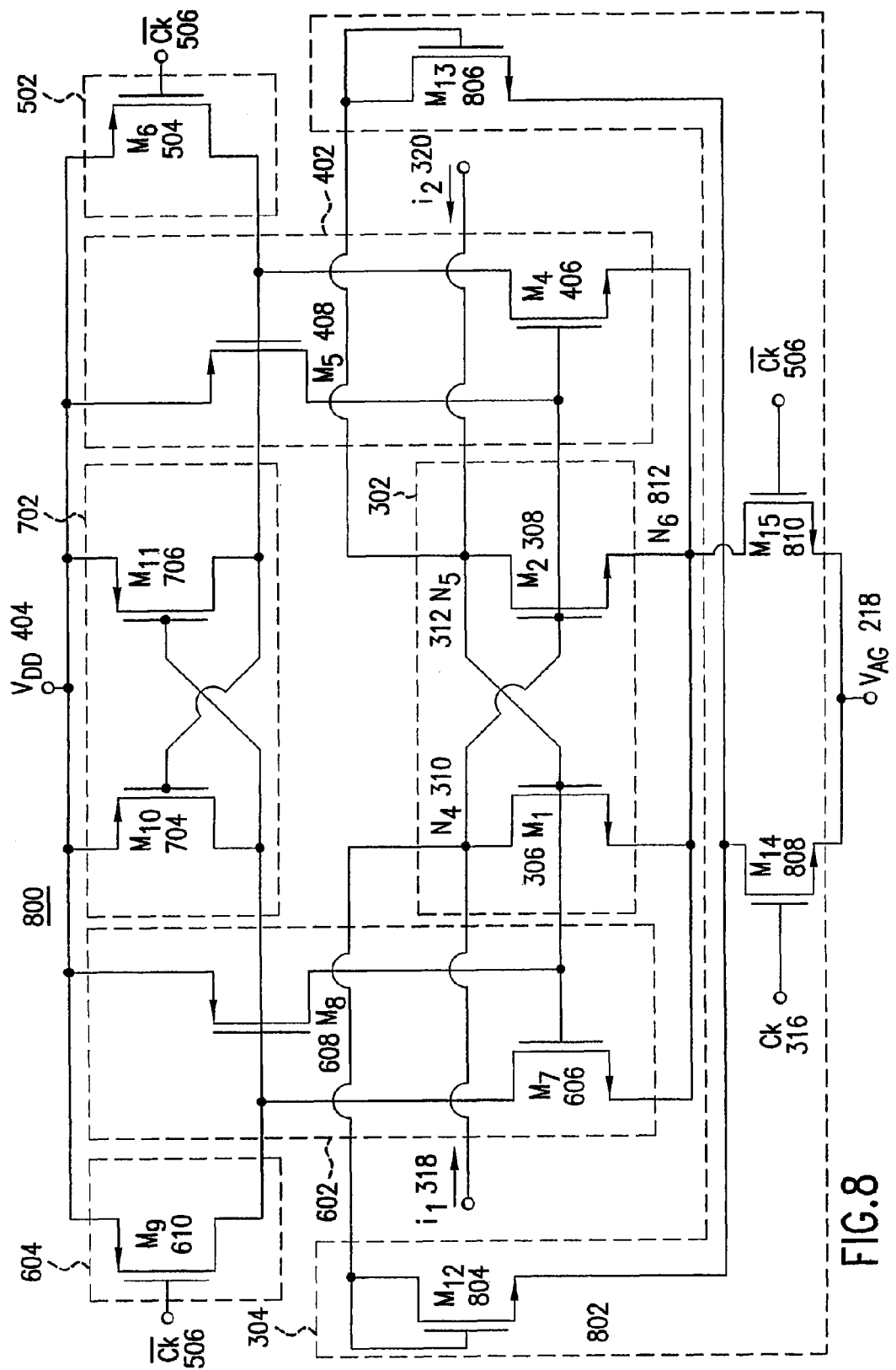
FIG. 8 is a schematic diagram of a latch circuit 800, in which reset switch 304 of latch circuit 700 is replaced by a reset circuit 802.

FIG. 8 is a schematic diagram of a latch circuit 800, in which $M_3$ 314 of reset switch 304 of latch circuit 700 is replaced by a reset circuit 802. Preferably, reset circuit 802 comprises a sixth NMOSFET "$M_{12}$" 804, a seventh NMOSFET "$M_{13}$" 806, an eighth NMOSFET "$M_{14}$" 808, and a ninth NMOSFET "$M_{15}$" 810. The skilled artisan will appreciate that $M_{12}$ 804, $M_{13}$ 806, $M_{14}$ 808, and $M_{15}$ 810 can also be realized in other field effect, junction, or combination transistor technologies. In general, $M_{14}$ 808 and $M_{15}$ 810 can be realized in a variety of switch technologies, including microelectromechanical embodiments, while $M_{12}$ 804 and $M_{13}$ 806 can be realized using diodes.

In latch circuit 800, the source terminals of $M_1$, 306, $M_2$ 308, $M_4$ 406, and $M_7$ 606 are together connected to a third node "$N_6$" 812. In reset circuit 802, the gate and drain terminals of $M_{12}$ 804 are together connected to $N_4$ 310. The gate and drain terminals of $M_{13}$ 806 are together connected to $N_5$ 312. The source terminals of $M_{12}$ 804 and $M_{13}$ 806 are together connected to the drain terminal of $M_{14}$ 808. The drain terminal of $M_{15}$ 810 is connected to $N_6$ 812. The source terminals of $M_{14}$ 808 and $M_{15}$ 810 are together connected to analog ground $V_{AG}$ 218. (Alternatively, analog ground $V_{AG}$ 218 can be replaced by first supply voltage "$V_{ss}$".) Clock waveform Ck 316 is applied to the gate terminal of $M_{14}$ 808. Inverse clock waveform Ck.bar 506 is applied to the gate terminal of $M_{15}$ 810.

With the gate and drain terminals of $M_{12}$ 804 connected together, $M_{12}$ 804 turns ON when its gate-to-source voltage is greater than its threshold voltage. Likewise, with the gate and drain terminals of $M_{13}$ 806 connected together, $M_{13}$ 806 turns ON when its gate-to-source voltage is greater than its threshold voltage. When the voltage of Ck 316 is UP (i.e., the reset phase), $M_{14}$ 808 reduces the voltages at the source terminals of $M_{12}$ 804 and $M_{13}$ 806 so that their gate-to-source voltages are greater than their threshold voltages and $M_{12}$ 804 and $M_{13}$ 806 turn ON. When $M_{12}$ 804 and $M_{13}$ 806 are ON, they connect $N_4$ 310 and $N_5$ 312 together. Contemporaneously, when the voltage of Ck.bar 506 is DOWN (i.e., the reset phase), $M_{15}$ 810 disconnects $N_6$ 812 from analog ground $V_{AG}$ 218. This insulates bistable pair 302, vertical latch 402, and second vertical latch 602 from the connection between $N_4$ 310 and $N_5$ 312 provided by $M_{12}$ 804 and $M_{13}$ 806. The connection between $N_4$ 310 and $N_5$ 312 provided by $M_{12}$ 804 and $M_{13}$ 806 causes the steady state voltages at both nodes to be equal. First and second current signals $i_1$ 318 and $i_2$ 320 flow through $M_{12}$ 804 and $M_{13}$ 806, which are sized so that, under these conditions, their drain-to-source voltages are MID. Thus, the voltages at $N_4$ 310 and $N_5$ 312 are equal to MID.

When the voltage of Ck.bar 506 is UP and the voltage of Ck 316 is DOWN (i.e., the sampling phase), $M_{15}$ 810 connects $N_6$ 812 to analog ground $V_{AG}$ 218, $M_{14}$ 808 raises the voltages at the source terminals of $M_{12}$ 804 and $M_{13}$ 806 so that their gate-to-source voltages are less than their threshold voltages and $M_{12}$ 804 and $M_{13}$ 806 turn OFF, and latch circuit 800 operates in the same manner as latch circuit 700 described above.

In latch circuits 300, 400, 500, 600, and 700, the source terminal of $M_3$ 314 is connected to the drain terminal of one of $M_1$ 306 or $M_2$ 308; the drain terminal of $M_3$ 314 is connected the drain terminal of the other of $M_1$ 306 or $M_2$ 308. Clock waveform Ck 316 is applied to the gate terminal of $M_3$ 314. When the voltage of Ck 316 is UP, $M_3$ 314 connects the gate and drain terminals of $M_1$ 306 and $M_2$ 308 together. This requires that the UP voltage of Ck 316 be greater than the sum of HIGH and the threshold voltage of $M_3$ 314. This can pose a problem when these latch circuits are realized in integrated circuits with low power supply voltages. Advantageously, in latch circuit 800, the source terminals of $M_{14}$ 808 and $M_{15}$ 810 are connected to analog ground $V_{AG}$ 218 so that the UP voltage of Ck 316 only needs to be greater than the threshold voltages of $M_{14}$ 808 and $M_{15}$ 810.

FIG. 9 shows a flow chart of a method 900 for decreasing the time in which a latch circuit port receiving a current signal greater than a bias current reaches a steady state voltage. The latch circuit comprises a bistable pair of cross connected transistors of a first polarity, and a third transistor of a second polarity. For example, the drain terminal of a first FET of a first polarity is connected to the gate terminal of a second FET of the first polarity, the drain terminal of the second FET is connected to the gate terminal of the first FET, the source terminals of the FETs are connected together, and a third FET of a second polarity is provided. In another example, the collector terminal of a first junction transistor of a first polarity is connected to the base terminal of a second junction transistor of the first polarity, the collector terminal of the second junction transistor is connected to the base terminal of the first junction transistor, the emitter terminals of the junction transistors are connected together, and a third junction transistor of a second polarity is provided.

At a step 902, the current signal greater than the bias current is amplified with the third transistor. At a step 904, the amplified current signal is applied to the latch circuit port receiving the current signal greater than the bias current. For example, a current signal greater than a bias current (e.g., $i_1$ 318) is received at a latch circuit port (e.g., $N_4$ 310) and continues to charge the parasitic capacitances at the latch circuit port, which causes the voltage at the latch circuit port to rise. The voltage at the latch circuit port is amplified by a third transistor (e.g., $M_5$ 408) so that it draws current from a power supply (e.g., $V_{DD}$ 404). The current drawn from the power supply is applied to the latch circuit port. Thus, the parasitic capacitances at the latch circuit port are charged under the combined effects of the current signal greater than the bias current and the current drawn from the power supply. This decreases the time in which the latch circuit port receiving the current signal greater than the bias current reaches the steady state voltage.

Figure 10:
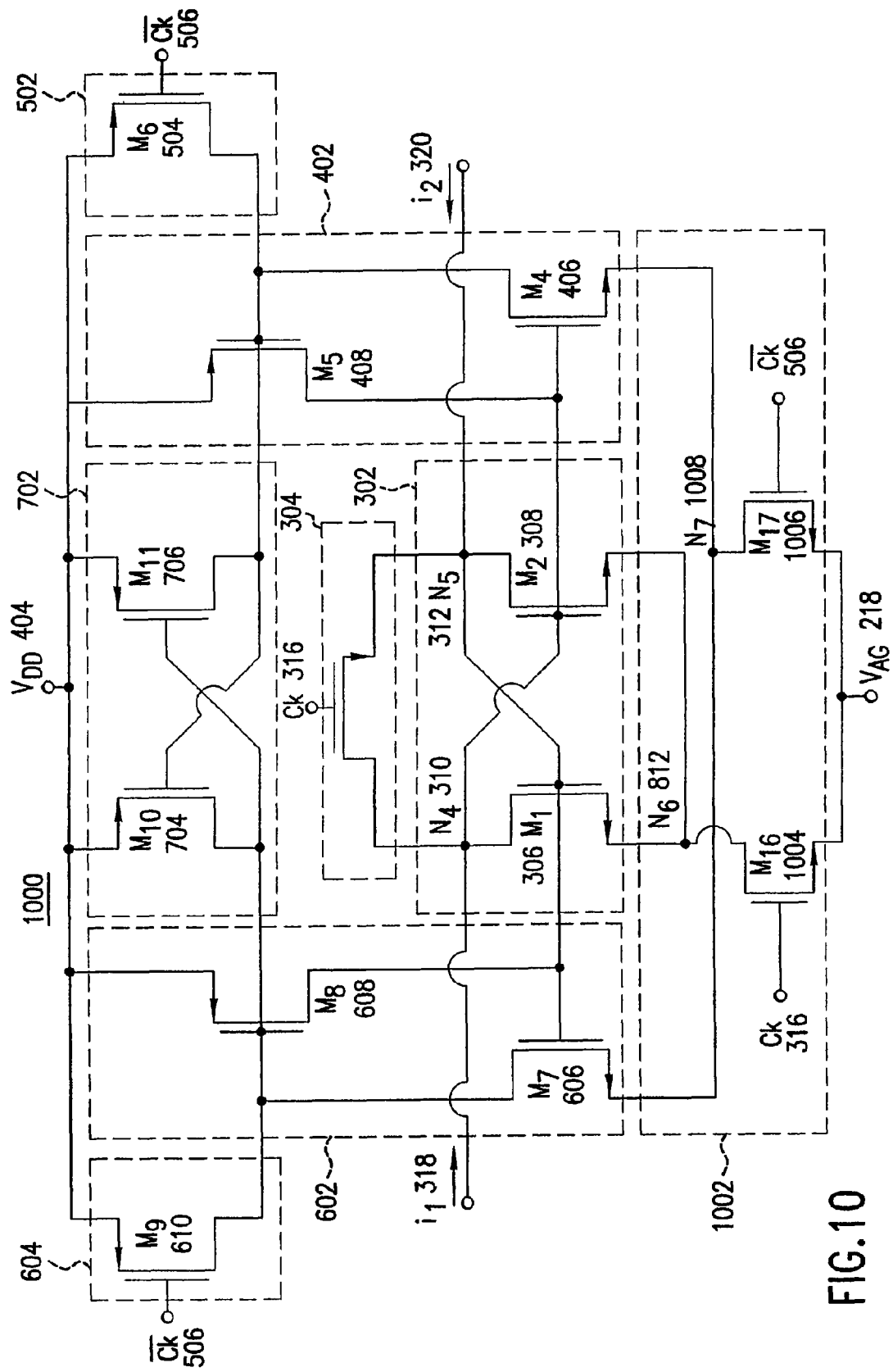
FIG. 10 is a schematic diagram of a latch circuit 1000, in which latch circuit 700 further comprises a reset circuit 1002.

FIG. 10 is a schematic diagram of a latch circuit 1000, in which latch circuit 700 further comprises a reset circuit 1002. Preferably, reset circuit 1002 comprises a tenth NMOSFET "$M_{16}$" 1004 and an eleventh NMOSFET "$M_{17}$" 1006. The skilled artisan will appreciate that $M_{16}$ 1004 and $M_{17}$ 1006 can also be realized in other field effect, junction, or combination transistor technologies. In general, $M_{16}$ 1004 and $M_{17}$ 1006 can be realized in a variety of switch technologies, including microelectromechanical embodiments.

In latch circuit 1000, the source terminals of $M_1$ 308 and $M_2$ 310 are together connected to third node $N_6$ 812, and the source terminals of $M_4$ 406 and $M_7$ 606 are together connected to a fourth node "$N_7$" 1008. In reset circuit 1002, the drain terminal of $M_{16}$ 1004 is connected to $N_6$ 812, and the drain terminal of $M_{17}$ 1006 is connected to $N_7$ 1008. The source terminals of $M_{16}$ 1004 and $M_{17}$ 1006 are together connected to analog ground $V_{AG}$ 218. (Alternatively, analog ground $V_{AG}$ 218 can be replaced by first supply voltage "$V_{SS}$".) Clock waveform Ck 316 is applied to the gate terminal of $M_{16}$ 1004. Inverse clock waveform Ck.bar 506 is applied to the gate terminal of $M_{17}$ 1006.

When the voltage of Ck 316 is UP and the voltage of Ck.bar 506 is DOWN (i.e., the reset phase), $M_{16}$ 1004 connects $N_6$ 812 to analog ground $V_{AG}$ 218, and $M_{17}$ 1006 disconnects $N_7$ 1008 from analog ground $V_{AG}$ 218. With the voltages at the source terminals of $M_4$ 406 and $M_7$ 606 not held equal to analog ground $V_{AG}$ 218, the gate-to-source voltages of $M_4$ 406 and $M_7$ 606 are less than their threshold voltages so that $M_4$ 406 and $M_7$ 606 turn OFF. Having $M_4$ 406 and $M_7$ 606 turned OFF prevents them from drawing current during the reset phase. Thus, for comparable realizations of latch circuits 700 and 1000, latch circuit 1000 consumes less power.

When the voltage of Ck.bar 506 is UP and the voltage of Ck 316 is DOWN (i.e., the sampling phase), $M_{16}$ 1004 disconnects $N_6$ 812 from analog ground $V_{AG}$ 218, and $M_{17}$ 1006 connects $N_7$ 1008 to analog ground $V_{AG}$ 218, and latch circuit 1000 operates in the same manner as latch circuit 700 described above.

Figure 11:
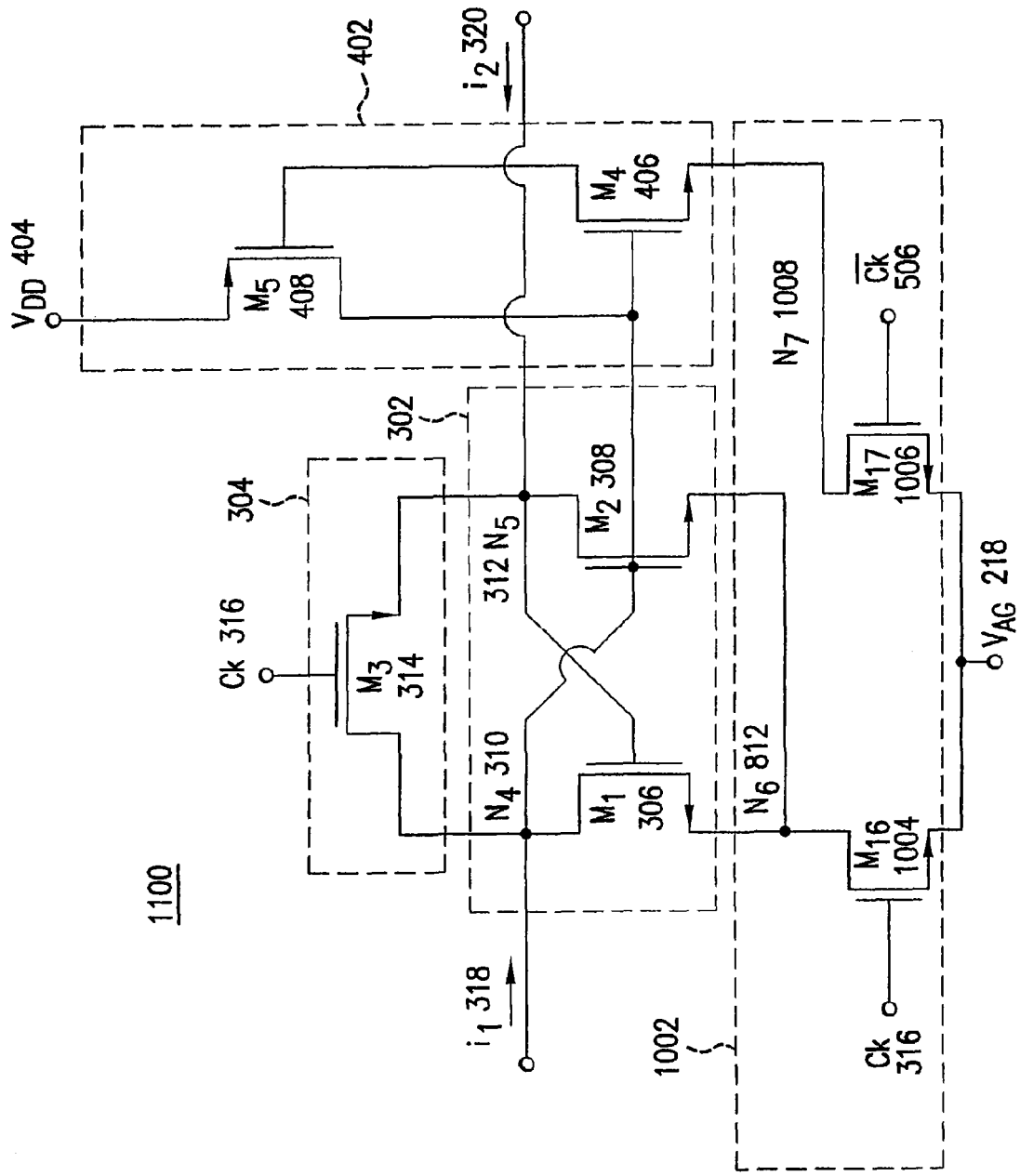
FIG. 11 is a schematic diagram of a latch circuit 1100, in which latch circuit 400 further comprises reset circuit 1002.

FIG. 11 is a schematic diagram of a latch circuit 1100, in which latch circuit 400 further comprises reset circuit 1002. In latch circuit 1100, the source terminals of $M_1$ 308 and $M_2$ 310 are together connected to third node $N_6$ 812, and the source terminal of $M_4$ 406 is connected to fourth node $N_7$ 1008. When the voltage of Ck 316 is UP and the voltage of Ck.bar 506 is DOWN (i.e., the reset phase), $M_{16}$ 1004 connects $N_6$ 812 to analog ground $V_{AG}$ 218, $M_{17}$ 1006 disconnects $N_7$ 1008 from analog ground $V_{AG}$ 218, and reset circuit 1102 operates in the same manner as described above. When the voltage of Ck.bar 506 is UP and the voltage of Ck 316 is DOWN (i.e., the sampling phase), $M_{16}$ 1004 disconnects $N_6$ 812 from analog ground $V_{AG}$ 218, and $M_{17}$ 1006 connects $N_7$ 1008 to analog ground $V_{AG}$ 218, and latch circuit 1100 operates in the same manner as latch circuit 400 described above.

Figure 12:
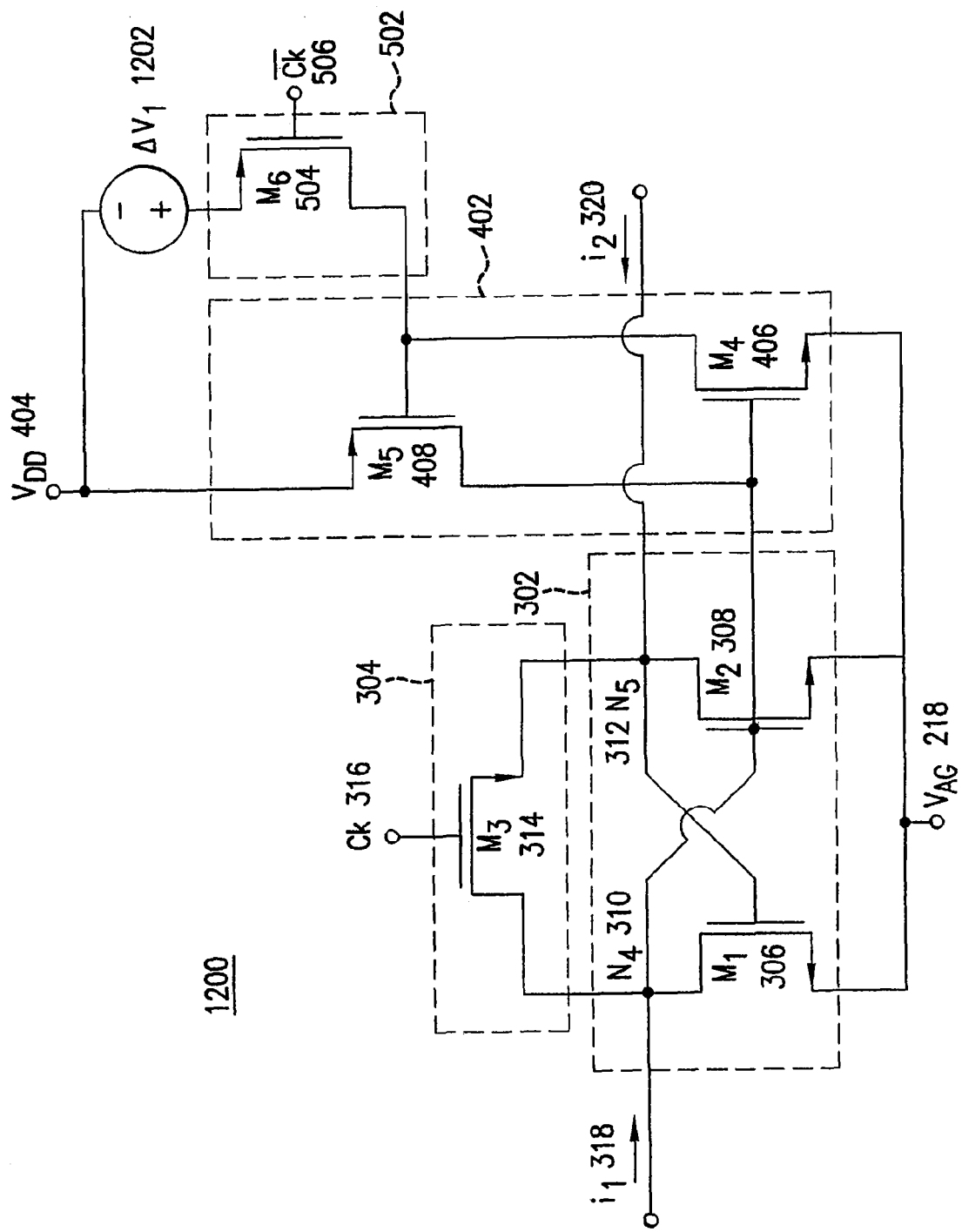
FIG. 12 is a schematic diagram of a latch circuit 1200, in which latch circuit 500 further comprises a voltage source "$\Delta V_1$" 1202.

FIG. 12 is a schematic diagram of a latch circuit 1200, in which latch circuit 500 further comprises a voltage source "$\Delta V_1$" 1202. Voltage source $\Delta V_1$ 1202 is connected between the source terminal of $M_6$ 504 and second supply voltage $V_{DD}$ 404.

When the voltage of Ck.bar 506 is DOWN (i.e., the reset phase), $M_6$ 504 connects the gate terminal of $M_5$ 408 to voltage source $\Delta V_1$ 1202. Voltage source $\Delta V_1$ 1202 is set to a voltage level that holds $M_5$ 408 OFF when the gate terminal of $M_5$ 408 is connected to voltage source $\Delta V_1$ 1202. This disrupts the latching action of vertical latch 402 so that bistable pair 302 can assume a state independent of the state of vertical latch 402 as described above.

However, unlike latch circuit 500, which holds the voltage at the gate terminal of $M_5$ 408 equal to the voltage of second supply voltage $V_{DD}$ 404, latch circuit 1200 holds the voltage at the gate terminal of $M_5$ 408 equal to the difference between the voltages of supply voltage $V_{DD}$ 404 and voltage source $\Delta V_1$ 1202. This reduces the time in which $M_6$ 504 changes state from ON to OFF when the voltage of Ck.bar 506 changes from DOWN to UP (i.e., the sampling phase). In turn, this reduces the time in which vertical latch 402 can resume its latching action to decrease the time necessary for the port (i.e., $N_4$ 310) receiving the current signal (i.e., $i_1$ 318) that is greater than bias current $i_b$ to reach its new steady state voltage. The skilled artisan will appreciate that the function of voltage source $\Delta V_1$ 1202 could be realized using a variety of devices including, but not limited to, a resistor, a diode-connected MOSFET, or a bias current source.

Figure 13:
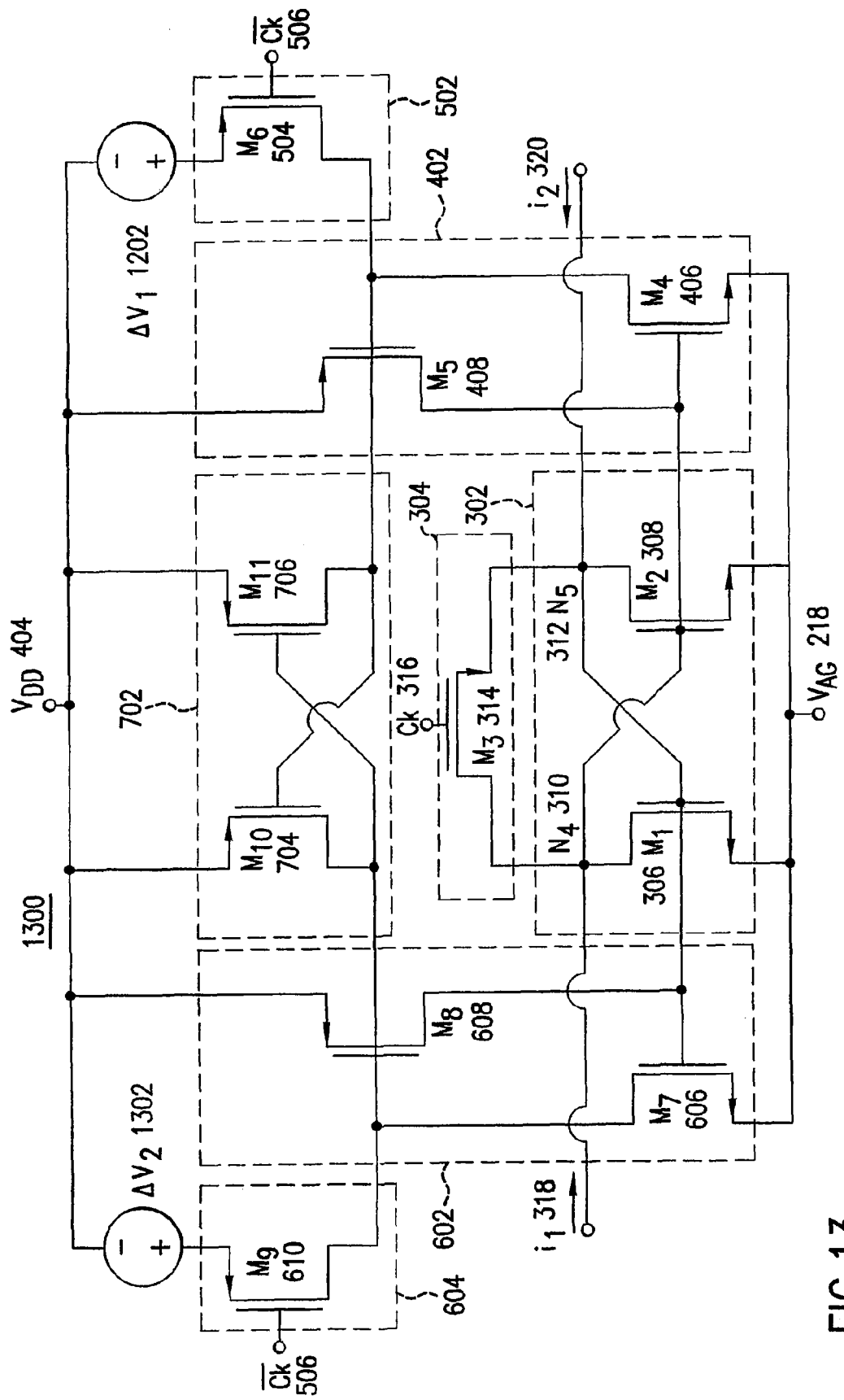
FIG. 13 is a schematic diagram of a latch circuit 1300, in which latch circuit 700 further comprises voltage source $\Delta V_1$ 1202 and a second voltage source "$\Delta V_2$" 1302.

FIG. 13 is a schematic diagram of a latch circuit 1300, in which latch circuit 700 further comprises voltage source $\Delta V_1$ 1202 and a second voltage source "$\Delta V_2$" 1302. Voltage source $\Delta V_1$ 1202 is connected between the source terminal of $M_6$ 504 and second supply voltage $V_{DD}$ 404. Second voltage source $\Delta V_2$ 1302 is connected between the source terminal of $M_9$ 610 and second supply voltage $V_{DD}$ 404.

Second voltage source $\Delta V_2$ 1302 operates in the same manner as voltage source $\Delta V_1$ 1202. Whereas, when the voltage of Ck.bar 506 changes from DOWN to UP (i.e., the sampling phase), voltage source $\Delta V_1$ 1202 reduces the time in which $M_6$ 504 changes state from ON to OFF, second voltage source $\Delta V_2$ 1302 reduces the time in which $M_9$ 610 changes state from ON to OFF. Because the time in which either port (i.e., $N_4$ 310 or $N_5$ 312) receiving current signal (i.e., $i_1$ 318 or $i_2$ 320) that is greater than bias current $i_b$ reaches its new steady state voltage is decreased, the frequency of Ck 316 (and Ck.bar 506) can be increased. This can increase the processing speed of an ADC that incorporates latch circuit 1300. Alternatively, the bit error rate of a system that uses an ADC that incorporates latch circuit 1300 can be improved. As is the case with voltage source $\Delta V_1$ 1202, the function of second voltage source $\Delta V_2$ 1302 could be realized using a variety of devices.

Figure 14:
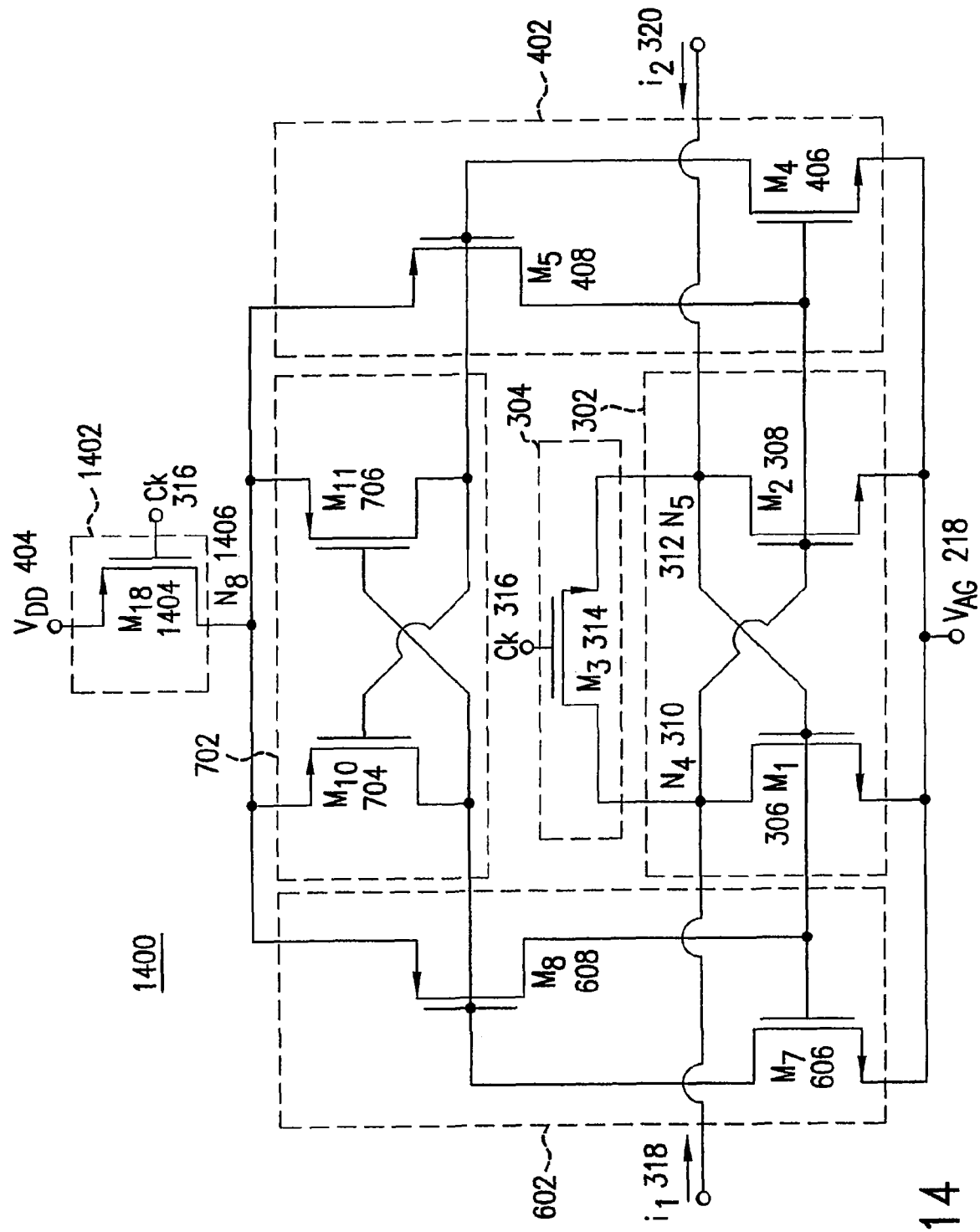
FIG. 14 is a schematic diagram of a latch circuit 1400, in which vertical latch reset switch 502 and second vertical latch reset switch 604 of latch circuit 700 are replaced by a third vertical latch reset switch 1402.

FIG. 14 is a schematic diagram of a latch circuit 1400, in which vertical latch reset switch 502 and second vertical latch reset switch 604 of latch circuit 700 are replaced by a third vertical latch reset switch 1402. Preferably, third vertical latch reset switch 1402 comprises a seventh PMOSFET "$M_{18}$" 1404. The skilled artisan will appreciate that $M_{18}$ 1404 can also be realized in other field effect, junction, or combination transistor technologies. In general, $M_{18}$ 1404 can be realized in a variety of switch technologies, including microelectromechanical embodiments.

In latch circuit 1400, the source terminals of $M_5$ 408, $M_8$ 608, $M_{10}$ 704, and $M_{11}$ 706 are together connected to a fifth node "$N_8$" 1406. In third vertical latch reset switch 1402, the drain terminal of $M_{18}$ 1404 is connected to $N_8$ 1406. The source terminal of $M_{18}$ 1404 is connected to second supply voltage $V_{DD}$ 404. Clock waveform Ck 316 is applied to the gate terminal of $M_{18}$ 1404.

Latch circuit 1400 is configured so that, when the voltage of Ck 316 is DOWN (i.e., the sampling phase), the gate-to-source voltage of $M_{18}$ 1404 (i.e., a PMOSFET) is less than its threshold voltage and $M_{18}$ 1404 turns ON. When $M_{18}$ 1404 is ON, it connects $N_8$ 1406 to second supply voltage $V_{DD}$ 404, and latch circuit 1400 operates in a similar manner as latch circuit 700 described above.

However, when the voltage of Ck 316 is UP (i.e. the reset phase), the gate-to-source voltage of $M_{18}$ 1404 (i.e., a PMOSFET) is greater than its threshold voltage so that $M_{18}$ 1404 turns OFF. This reduces the voltage at the source terminals of $M_5$ 408, $M_8$ 608, $M_{10}$ 704, and $M_{11}$ 706 (i.e., PMOSFETs) so that their gate-to-source voltages are less than their threshold voltages and $M_5$ 408, $M_8$ 608, $M_{10}$ 704, and $M_{11}$ 706 also turn OFF. In turn, this reduces the voltages at the drain terminals of $M_4$ 406 and $M_7$ 606 (i.e., NMOSFETs) so that their drain-to-source voltages are less than the differences between their gate-to-source voltages and their threshold voltages, and $M_4$ 406 and $M_7$ 606 also turn OFF. Having $M_4$ 406 and $M_7$ 606 turned OFF prevents them from drawing current during the reset phase. Thus, for comparable realizations of latch circuits 700 and 1400, latch circuit 1400 consumes less power.

Figures 15, 17:
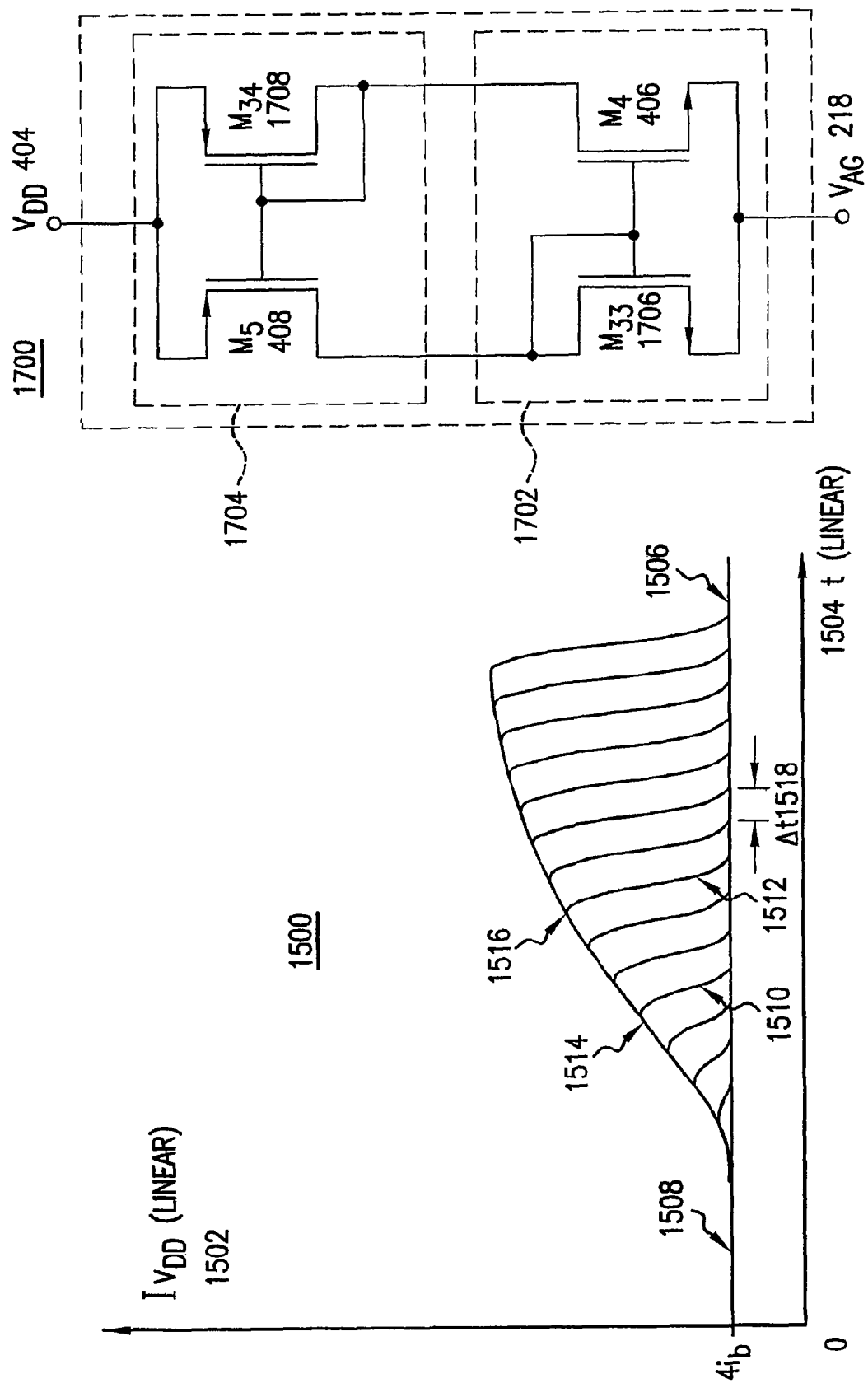
FIG. 15 is a graph 1500 of a current "$V_{DD}$" 1502 drawn by latch circuit 700 as a function of time "t" 1504 after the voltage of Ck 316 changes from UP to DOWN.
FIG. 17 is a schematic diagram of an alternative embodiment 1700 of vertical latch 402.

FIG. 15 is a graph 1500 of a current "$Iv_{DD}$" 1502 drawn by latch circuit 700 as a function of time "t" 1504 after the voltage of Ck 316 changes from UP to DOWN. Graph 1500 comprises a series of curves including, but not limited to, a first curve 1506, a second curve 1508, a third curve 1510, and a fourth curve 1512.

At steady state, latch circuit 700 draws current $Iv_{DD}$ 1502 equal to four times bias current $i_b$. Recalling Eqs. (1) and (2), the sum of the currents drawn by $M_1$ 306 and $M_2$ 308 is equal to twice bias current $i_b$. Additionally, $M_4$ 406 mirrors the current drawn by $M_2$ 308, while $M_7$ 606 mirrors the current drawn by $M_1$ 306. (During the sampling phase, the currents drawn by $M_4$ 406 and $M_7$ 606 are from the parasitic capacitances associated with, respectively, $M_5$ 408 and $M_8$ 608.)

In latch circuit 700, during the reset phase, $M_1$ 306, $M_2$ 308, $M_4$ 406, and $M_7$ 606 are turned ON, while $M_5$ 408, $M_8$ 608, $M_{10}$ 704, and $M_{11}$ 706 are turned OFF. During the sampling phase, the states of $M_1$ 306 and $M_2$ 308 are controlled by first and second current signals $i_1$ 318 and $i_2$ 320. For example, if first current signal $i_1$ 318 is greater than bias current $i_b$, $M_1$ 306 turns OFF while $M_2$ 308 remains ON. Under these conditions, at steady state, $M_5$ 408 and $M_{10}$ 704 also turn ON, while $M_7$ 606 turns OFF. $M_4$ 406 remains ON, and $M_8$ 608 and $M_{11}$ 706 remain OFF. However, although $M_5$ 408 and $M_{10}$ 704 are ON, because $M_1$ 306 and $M_7$ 606 are OFF, latch circuit 700 does not draw any additional current $Iv_{DD}$ 1502. In graph 1500, this situation is indicated by first curve 1506, which equals a steady state current of four times bias current $i_b$.

As mentioned above, the time in which $M_1$ 306 and $M_2$ 308 change states is a function of the sizes of first and second current signals $i_1$ 318 and $i_2$ 320. If the current signal (e.g., $i_1$ 318 or $i_2$ 320) received at the port (e.g., $N_4$ 310 or $N_5$ 312) of the MOSFET changing state from ON to OFF is sufficiently large, the port reaches its new steady state voltage relatively quickly, and the appropriate MOSFETs of latch circuit 700 also change states relatively quickly. Thus, during a relatively quick transient, again no additional current $Iv_{DD}$ 1502 is drawn by latch circuit 700. This situation is indicated by second curve 1508, which also equals a steady state current of four times bias current $i_b$.

However, if the time of the transient becomes longer, latch circuit 700 acts to decrease the time needed for the port (e.g., $N_4$ 310 or $N_5$ 312) receiving the current signal (e.g., $i_1$ 318 or $i_2$ 320) greater than bias current $i_b$ to reach its new steady state voltage. In this situation, latch circuit 700 draws current $Iv_{DD}$ 1502 as charted by, for example, third curve 1510. As indicated by the shape of third curve 1510, current $Iv_{DD}$ 1502 drawn by latch circuit 700 increases at a relatively slow rate, reaches a peak value 1514, then decreases relatively quickly. Peak value 1514 is reached when the latching action of latch circuit 700 occurs.

If the time of the transient becomes increasingly longer, latch circuit 700 draws current $Iv_{DD}$ 1502 for a longer period of time, as charted by, for example, fourth curve 1512. As indicated by the shape of fourth curve 1512, current $Iv_{DD}$ 1502 drawn by latch circuit 700 increases at the same rate as indicated by third curve 1510. However, current $Iv_{DD}$ 1502 is drawn for a longer period of time resulting in fourth curve 1512 having a higher peak value 1516.

Graph 1500 shows how latch circuit 700 decreases the time needed for the port (e.g., $N_4$ 310 or $N_5$ 312) receiving the current signal (e.g., $i_1$ 318 or $i_2$ 320) greater than bias current $i_b$ to reach its new steady state voltage, while limiting the power consumed to realize this decrease in time. Latch circuit 700 only draws current $Iv_{DD}$ 1502 in those situations in which first and second current signals $i_1$ 318 and $i_2$ 320 both have values near to that of bias current $i_b$ (i.e., small signal current $i_1$).

Of note, each curve of graph 1500 is separated from its next curve by an equal separation in time "$\Delta t$" 1518. However, each curve represents a ten-fold magnitude increase in current signal (e.g., $i_1$ 318 or $i_2$ 320) over the next curve to the right. For example, current signal (e.g., $i_1$ 318 or $i_2$ 320) for curve 1510 is one-thousand times greater than current signal (e.g., $i_1$ 318 or $i_2$ 320) for curve 1512.

Figure 16:
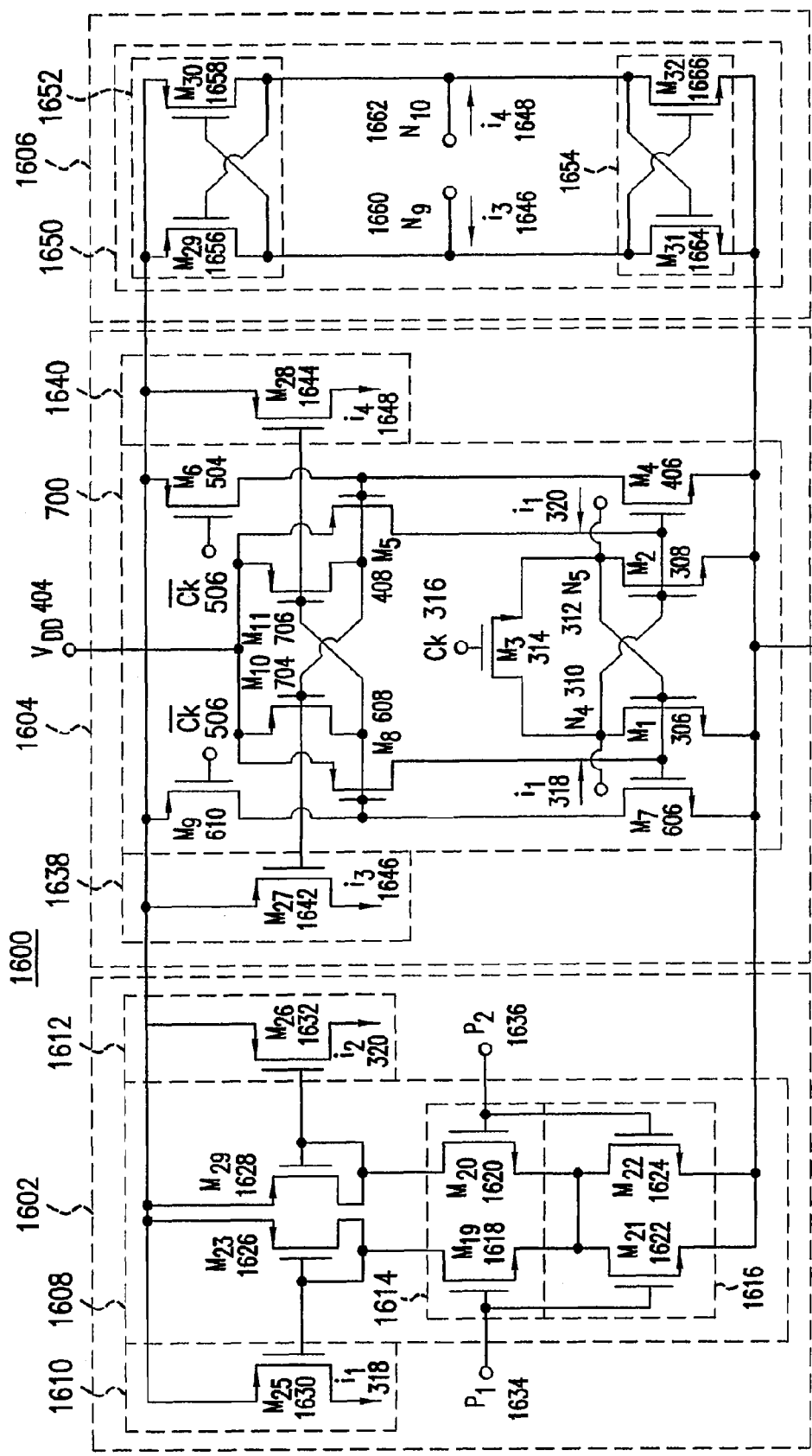
FIG. 16 is a schematic diagram of a comparator 1600 implemented using latch circuit 700.

FIG. 16 is a schematic diagram of a comparator 1600 implemented using latch circuit 700. Comparator 1600 comprises an input stage 1602, a latch circuit 1604, and an output stage 1606. Preferably, input stage 1602 comprises a differential amplifier 1608, a first current mirror 1610, and a second current mirror 1612.

Preferably, differential amplifier 1608 comprises a differential pair 1614 and a current source 1616. Preferably, differential pair 1614 comprises amplifying MOSFETs "$M_{19}$" 1618 and "$M_2$" 1620. Preferably, current source 1616 comprises biasing MOSFETs "$M_{21}$" 1622 and "$M_{22}$" 1624. A biasing MOSFET is connected to the source terminal of each amplifying MOSFET. The drain terminal of "$M_{21}$" 1622 is connected to the source terminal of $M_{19}$ 1618; the drain terminal of "$M_{22}$" 1624 is connected to the source terminal of $M_{20}$ 1620. The drain terminals of $M_{21}$ 1622 and $M_{22}$ 1624 are also connected together. The source terminals of $M_{21}$ 1622 and $M_{22}$ 1624 are together connected to analog ground $V_{AG}$ 218. (Alternatively, analog ground $V_{AG}$ 218 can be replaced by first supply voltage "$V_{SS}$".) A load MOSFET is connected to the drain terminal of each amplifying MOSFET. The drain terminal of "$M_{23}$" 1626 is connected to the drain terminal of $M_{19}$ 1618; the drain terminal of "$M_{24}$" 1628 is connected to the drain terminal of $M_{20}$ 1620. The source terminals of $M_{23}$ 1626 and $M_{24}$ 1628 are together connected to second supply voltage $V_{DD}$ 404.

Preferably, first current mirror 1610 comprises a MOSFET "$M_{25}$" 1630, and second current mirror 1612 comprises a MOSFET "$M_{26}$" 1632. The source terminals of $M_{25}$ 1630 and $M_{26}$ 1632 are together connected to second supply voltage $V_{DD}$ 404. The gate terminal of $M_{25}$ 1630 is connected to the gate and drain terminals of $M_{23}$ 1626; the gate terminal of $M_{26}$ 1632 is connected to the gate and drain terminals of $M_{24}$ 1628. In input stage 1602, $M_{19}$ 1618, $M_{20}$ 1620, $M_{21}$ 1622, and $M_{22}$ 1624 are NMOSFETs, while $M_{23}$ 1626 $M_{24}$ 1628 $M_{25}$ 1630, and $M_{26}$ 1632 are PMOSFETs. However, this configuration can be reversed depending upon the overall configuration of comparator 1600.

The voltage of analog signal x 228 is received by input stage 1602 at a first input port "$P_1$" 1634, which is the non-inverting terminal of comparator 1600 (e.g., A 202, B 204, or C 206). This allows the voltage of analog signal x 228 to be compared with the reference voltage received at second input port "$P_2$" 1636, which is the inverting terminal of comparator 1600. For example, the voltage of analog signal x 228 is compared with V/4, for comparator A 202; V/2, for comparator B 204; and 3V/4, for comparator C 206. First input port $P_1$ 1634 is connected to the gate terminals of $M_{19}$ 1618 and $M_{21}$ 1622. Second input port $P_2$ 1636 is connected to the gate terminals of $M_{20}$ 1620 and $M_{22}$ 1624.

Differential pair 1614 (i.e., $M_{19}$ 1618 and $M_{20}$ 1620) acts to control the distribution of current flowing through current source 1616 (e.g., $M_{21}$ 1622 and $M_{22}$ 1624). The sum of the current flowing through both $M_{19}$ 1618 and $M_{20}$ 1620 equals the current provided by current source 1616. For example, as the voltage received at first input port $P_1$ 1634 rises with respect to the voltage received at second input port $P_2$ 1636, the portion of the total current that flows through $M_{19}$ 1618 and $M_{23}$ 1626 increases, while the portion of the total current that flows through $M_{20}$ 1620 and $M_{24}$ 1628 decreases. $M_{25}$ 1630 mirrors the increase in current flowing through $M_{23}$ 1626 to produce first current signal $i_1$ 318 at the drain terminal of $M_{25}$ 1630. $M_{26}$ 1632 mirrors the decrease in current flowing through $M_{24}$ 1628 to produce second current signal $i_2$ 320 at the drain terminal of $M_{26}$ 1632.

In the above explanation, differential amplifier 1608 is configured so that the voltage of analog signal x 228 provides bias for $M_{21}$ 1622 of current source 1616, while the reference voltage provides bias for $M_{22}$ 1624 of current source 1616. The skilled artisan will appreciate that differential amplifier 1608 can also be configured with a traditional current source that is independently biased (i.e., the bias is not provided by the voltage of analog signal x 228 or the reference voltage).

Latch circuit 1604 comprises latch circuit 700, a third current mirror 1638, and a fourth current mirror 1640. Preferably, third current mirror 1638 comprises a MOSFET "$M_{27}$" 1642, and fourth current mirror 1640 comprises a MOSFET "$M_{28}$" 1644. The source terminals of $M_{27}$ 1642 and $M_{28}$ 1644 are together connected to second supply voltage $V_{DD}$ 404. The gate terminal of $M_{27}$ 1642 is connected to the gate terminal of $M_5$ 408; the gate terminal of $M_{28}$ 1644 is connected to the gate terminal of $M_9$ 608. In comparator 1600, latch circuit 700 can be replaced by any of latch circuits 800, 1000, 1300, or 1400. In latch circuit 1604, $M_{27}$ 1642 and $M_{28}$ 1644 are PMOSFETs. However, depending upon the overall configuration of comparator 1600, they can be NMOSFETs.

First current signal $i_1$ 318 and second current signal $i_2$ 320 are received at, respectively, $N_4$ 310 and $N_5$ 312 and are processed by latch circuit 700 as described above. $M_{27}$ 1642 mirrors the current flowing through $M_5$ 408 to produce a third current signal "$i_3$" 1646 at the drain terminal of $M_{27}$ 1642. $M_{28}$ 1644 mirrors the current flowing through $M_8$ 608 to produce a fourth current signal "$i_4$" 1648 at the drain terminal of $M_{28}$ 1644. Third current signal $i_3$ 1646 and fourth current signal $i_4$ 1648 are proportional to, respectively, the voltages at $N_4$ 310 and $N_5$ 312 (i.e., either HIGHER or LOWER).

Preferably, output stage 1606 comprises a hold latch 1650. Preferably, hold latch 1650 comprises a third bistable pair 1652 and a fourth bistable pair 1654. Preferably, third bistable pair 1652 comprises a first MOSFET "$M_{29}$" 1656 and a second MOSFET "$M_{30}$" 1658. The gate terminal of $M_{30}$ 1658 is connected to the drain terminal of $M_{29}$ 1656 at a first port "$N_9$" 1660. The gate terminal of $M_{29}$ 1656 is connected to the drain terminal of $M_{30}$ 1658 at a second port "$N_{10}$" 1662. The source terminals of $M_{29}$ 1656 and $M_{30}$ 1658 are together connected to second supply voltage $V_{DD}$ 404. Preferably, fourth bistable pair 1654 comprises a third MOSFET "$M_{31}$" 1664 and a fourth MOSFET "$M_{32}$" 1666. The gate terminal of $M_{32}$ 1666 is connected to the drain terminal of $M_{31}$ 1664 at first port $N_9$ 1660. The gate terminal of $M_{31}$ 1664 is connected to the drain terminal of $M_{32}$ 1666 at second port $N_{10}$ 1662. The source terminals of $M_{31}$ 1664 and $M_{32}$ 1666 are together connected to analog ground $V_{AG}$ 218. (Alternatively, analog ground $V_{AG}$ 218 can be replaced by first supply voltage "$V_{SS}$") In output stage 1606, $M_{29}$ 1656 and $M_{30}$ 1658 are PMOSFETs, while $M_{31}$ 1664 and $M_{32}$ 1666 are NMOSFETs. However, this configuration can be reversed depending upon the overall configuration of comparator 1600.

Third current signal $i_3$ 1646 is received at $N_9$ 1660, while fourth current signal $i_4$ 1648 is received at $N_{10}$ 1662. Typically, output stage 1606 is followed by digital logic circuits. Sometimes when latch circuit 1604 is resetting, the voltages at $N_4$ 310 and $N_5$ 312 are neither HIGHER nor LOWER, but some value in between. This can cause problems in the digital logic circuits. Hold latch 1650 retains the output of latch circuit 1604 prior to reset, which is either HIGHER or LOWER. Thus, output stage 1606 serves as a buffer between latch circuit 1604 and the digital logic circuits.

Another advantage of vertical latch circuit 402 can be observed by comparing it with hold latch 1650. In hold latch 1650, the sum of the gate-to-source voltage of $M_{29}$ 1656 and the gate-to-source voltage of $M_{31}$ 1664 is equal to the difference between $V_{DD}$ 404 and $V_{AG}$ 218. Implementations of hold latch 1650 must take this relationship into consideration. In contrast, for the same values of $V_{DD}$ 404 and $V_{AG}$ 218, each of $M_4$ 406 and $M_5$ 408 can realize a gate-to-source voltage that is larger than that of $M_{29}$ 1656 or $M_{31}$ 1664. Alternatively, by using vertical latch 402, the difference between $V_{DD}$ 404 and $V_{AG}$ 218 can be reduced, which can reduce the power consumed.

FIG. 17 is a schematic diagram of an alternative embodiment 1700 of vertical latch 402. Preferably, vertical latch 1700 comprises a first current mirror pair 1702 and a second current mirror pair 1704. Preferably, first current mirror pair 1702 comprises NMOSFET $M_4$ 406 and a twelfth NMOSFET "$M_{33}$" 1706. Preferably second current mirror pair 1704 comprises PMOSFET $M_5$ 408 and an eighth PMOSFET "$M_{34}$" 1708. The skilled artisan will appreciate that $M_{33}$ 1706 and $M_{34}$ 1708 can also be realized in other field effect, junction, or combination transistor technologies. $M_{33}$ 1706 and $M_{34}$ 1708 can also be realized using diodes.

In first current mirror pair 1702, the drain and gate terminals of $M_{33}$ 1706 are connected together, the gate terminal of $M_{33}$ 1706 is connected to the gate terminal of $M_4$ 406, the drain terminal of $M_{33}$ 1706 is connected to the drain terminal of $M_5$ 408, and the source terminals of $M_{33}$ 1706 and $M_4$ 406 are together connected to analog ground $V_{AG}$ 218. In second current pair 1704, the drain and gate terminals of $M_{34}$ 1708 are connected together, the gate terminal of $M_{34}$ 1708 is connected to the gate terminal of $M_5$ 408, the drain terminal of $M_{34}$ 1708 is connected to the drain terminal of $M_4$ 406, and the source terminals of $M_{34}$ 1708 and $M_5$ 408 are together connected to second supply voltage $V_{DD}$ 404.

$M_4$ 406, $M_5$ 408, $M_{33}$ 1706, and $M_{34}$ 1708 are sized so that the product of the current gain of first current mirror pair 1702 and the current gain of second current mirror pair 1704 (i.e., the loop gain of vertical latch 1700) is greater than one. This ensures that vertical latch 1700 will have a latching action. Vertical latch 1700 can also be an alternative embodiment for second vertical latch 602, with $M_4$ 406 replaced by $M_7$ 606, and $M_5$ 408 replaced by $M_8$ 608.

Diode-connected $M_{33}$ 1706 and $M_{34}$ 1708 provide vertical latch 1700 with several advantages. They provide bias voltages for, respectively, $M_4$ 406 and $M_5$ 408. This is particularly important for $M_5$ 408, which, absent vertical latch reset switch 502, lacks a bias voltage necessary to operate during the sampling phase.

Furthermore, the skilled artisan will appreciate that including vertical latch 402 in latch circuit 400 complicates problems with controlling the dynamic offset voltages in the latch circuit. These problems are particularly troublesome in vertical latch 402 because it comprises both NMOSFET $M_4$ 406 and PMOSFET $M_5$ 408, and therefore entails the difficulties associated with matching different MOSFET types. (In latch circuit 600, the difficulties arise in matching corresponding MOSFETs (i.e., $M_4$ 406 with $M_7$ 606, and $M_5$ 408 with $M_8$ 608).) However, diode-connected $M_{33}$ 1706 and $M_{34}$ 1708 can be sized to bias, respectively, $M_4$ 406 and $M_5$ 408 in a manner that corrects the detrimental effects of their offset voltages.

Additionally, while each of the various latch circuit configurations presented above is designed to decrease the time necessary for the port (i.e., $N_4$ 310 or $N_5$ 312) receiving the current signal (i.e., $i_1$ 318 or $i_2$ 320) that is greater than bias current $i_b$ to reach its new steady state voltage, several of the configurations are also designed to limit the power consumed while realizing this decrease in time. Diode-connected $M_{33}$ 1706 and $M_{34}$ 1708 enable a designer to bias, respectively, $M_4$ 406 and $M_5$ 408 in a manner that controls when they will change states during a transient. This allows the designer to balance the competing needs for decreasing the time necessary for the latch circuit to reach steady state and limiting the power consumed by the latch circuit.

FIG. 18 shows a flow chart of a method 1800 for reducing the power consumed by a latch circuit. The latch circuit comprises a bistable pair and a vertical latch, wherein the bistable pair has a first MOSFET (e.g., $M_1$ 306) and a second MOSFET (e.g., $M_2$ 308) configured so that the drain terminal of the first MOSFET is connected to the gate terminal of the second MOSFET at a first port (e.g., $N_4$ 310), the drain terminal of the second MOSFET is connected to the gate terminal of the first MOSFET at a second port (e.g., $N_5$ 312), and the source terminals of the first and second MOSFETs are connected together, and wherein the vertical latch has a third MOSFET (e.g., $M_4$ 406) and a fourth MOSFET (e.g., $M_5$ 408) configured so that the gate terminal of the third MOSFET is connected to the gate terminal of the second MOSFET and the drain terminal of the fourth MOSFET, and the gate terminal of the fourth MOSFET is connected to the drain terminal of the third MOSFET.

At a step 1802, the bistable pair and vertical latch are reset. In one alternative, at a step 1804, the fourth MOSFET is held OFF during the resetting, thereby reducing the power consumed by the latch circuit during the resetting. For example, the voltage at the source terminal of the fourth MOSFET (e.g., $M_5$ 408) is held constant, while the voltage at the gate terminal of the fourth MOSFET is changed, so that the fourth MOSFET is held OFF during the resetting. In another example, the voltage at the drain terminal of the fourth MOSFET (e.g., $M_5$ 408) is held constant, while the voltage at the source terminal of the fourth MOSFET is changed, so that the fourth MOSFET is held OFF during the resetting.

In another alternative, at a step 1806, the third MOSFET is held OFF during the resetting, thereby reducing the power consumed by the latch circuit during the resetting. For example, the voltage at the gate terminal of the third MOSFET (e.g., $M_4$ 406) is held constant, while the voltage at the source terminal of the third MOSFET is changed, so that the third MOSFET is held OFF during the resetting. In another example, the voltage at the source terminal of the third MOSFET (e.g., $M_4$ 406) is held constant, while the voltage at the drain terminal of the third MOSFET is changed, so that the third MOSFET is held OFF during the resetting.

In yet another alternative, at a step 1808, after the resetting, the fourth MOSFET is held OFF when the second MOSFET changes state from ON to OFF, thereby reducing the power consumed by the latch circuit after the resetting. For example, after the resetting, the voltage at the source terminal of the fourth MOSFET (e.g., $M_5$ 408) is held constant, while the voltage at the gate terminal of the fourth MOSFET is changed, so that the fourth MOSFET is held OFF when the second MOSFET changes state from ON to OFF.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A latch circuit, comprising:
a bistable pair of transistors connected between a reset switch and a first supply voltage, and having a first port configured to receive a first current signal contemporaneously with a second current signal and to produce a first output voltage, and a second port configured to receive a third current signal and to produce a second output voltage; and
a vertical latch connected between said first supply voltage and a second supply voltage, and connected to said first port;
wherein said vertical latch comprises:
a first current mirror transistor pair connected to said bistable pair of transistors and configured to produce said second current signal; and
a second current mirror transistor pair connected to said first current mirror transistor pair; and
wherein first and second drains of said first current mirror transistor pair are directly connected respectively to corresponding first and second drains of said second current mirror transistor pair to form respective first and second non-grounded drain nodes.

2. The latch circuit of claim 1, wherein a current gain of said first current mirror transistor pair is less than one.

3. The latch circuit of claim 1, wherein said reset switch is a microelectromechanical reset switch.

4. The latch circuit of claim 1, wherein said vertical latch is configured to decrease the time necessary for said first port to reach a steady state voltage in response to said first current signal received.

5. The latch circuit of claim 1, further comprising a vertical latch reset switch connected to said vertical latch.

6. The latch circuit of claim 1, further comprising a second vertical latch connected between said first supply voltage and said second supply voltage, and connected to said second port.

7. The latch circuit of claim 1, wherein transistors of said bistable pair of transistors are matched transistors.

8. The latch circuit of claim 1, wherein each of said bistable pair of transistors has a gain greater than one.

9. The latch circuit of claim 1, wherein a product of individual gains of each of said bistable pair of transistors is greater than one.

10. The latch circuit of claim 1, wherein said first current minor transistor pair comprises a first transistor and a first diode-connected transistor, and said second current minor transistor pair comprises a second transistor and a second diode-connected transistor, wherein said first diode-connected transistor and said second diode-connected transistor are sized to bias said first transistors and said second transistors in a manner that corrects detrimental effects of offset voltages.

11. The latch circuit of claim 1, wherein a product of a current gain of said first current mirror transistor pair and a current gain of said second current mirror transistor pair is less than one.

12. The latch circuit of claim 5, wherein said vertical latch reset switch is a microelectromechanical reset switch.

13. The latch circuit of claim 6, further comprising a second vertical latch reset switch connected to said second vertical latch.

14. The latch circuit of claim 1, wherein gates of said first current mirror transistor pair are directly connected to each other and to said first non-grounded drain node.

15. The latch circuit of claim 1, wherein gates of said second current mirror transistor pair are directly connected to each other and to said second non grounded drain node.

16. The latch circuit of claim 1, wherein voltage of said first non-grounded drain node is directly communicated to a second gate of said first current mirror transistor pair, and voltage of said second non-grounded drain node is directly communicated to a first gate of said second current mirror transistor pair.

17. A latch circuit, comprising:
a bistable pair of transistors connected between a reset switch and a first supply voltage, and having a first port configured to receive a first current signal and a second current signal and to produce a first output voltage, and a second port configured to receive a third current signal and to produce a second output voltage; and
a vertical latch connected between said first supply voltage and a second supply voltage, and connected to said first port;
wherein said vertical latch comprises:
a first current minor transistor pair connected to said bistable pair of transistors and configured to produce said second current signal; and
a second current minor transistor pair connected to said first current minor transistor pair; and
wherein transistors of said first current minor transistor pair are a first type, transistors of said second current mirror transistor pair are a second type, and said second type is different from said first type.

18. A latch circuit, comprising:
a bistable pair of transistors connected between a reset switch and a first supply voltage, and having a first port configured to receive a first current signal and a second current signal and to produce a first output voltage, and a second port configured to receive a third current signal and to produce a second output voltage; and
a vertical latch connected between said first supply voltage and a second supply voltage, and connected to said first port;
a vertical latch reset switch connected to said vertical latch;
wherein said vertical latch comprises:
a first current mirror transistor pair connected to said bistable pair of transistors and configured to produce said second current signal; and
a second current mirror transistor pair connected to said first current mirror transistor pair; and
wherein said reset switch is configured to receive a clock waveform signal, and said vertical latch reset switch is configured to receive an inverse clock waveform signal.

19. A latch circuit, comprising:
a bistable pair of transistors connected between a reset switch and a first supply voltage, and having a first port configured to receive a first current signal and a second current signal and to produce a first output voltage, and a second port configured to receive a third current signal and to produce a second output voltage; and
a vertical latch connected between said first supply voltage and a second supply voltage, and connected to said first port;
a second vertical latch connected between said first supply voltage and said second supply voltage, and connected to said second port;
a vertical latch reset switch connected to said vertical latch;
wherein said vertical latch comprises:
a first current mirror transistor pair connected to said bistable pair of transistors and configured to produce said second current signal; and
a second current mirror transistor pair connected to said first current mirror transistor pair; and
wherein said second vertical latch comprises:
a third current minor transistor pair connected to said bistable pair of transistors and configured to produce a fourth current signal; and
a fourth current minor transistor pair connected to said third current mirror transistor pair.

20. The latch circuit of claim 19, wherein a current gain of said third current mirror transistor pair is less than one.

21. The latch circuit of claim 19, wherein said second port is further configured to receive said fourth current signal.

22. The latch circuit of claim 19, wherein transistors of said third current minor transistor pair are a first type, transistors of said fourth current mirror transistor pair are a second type, and said second type is different from said first type.

23. The latch circuit of claim 19, wherein a product of a current gain of said third current mirror transistor pair and a current gain of said fourth current minor transistor pair is greater than one.

24. The latch circuit of claim 19, wherein said third current mirror transistor pair comprises a first transistor and a first diode-connected transistor, and said fourth current mirror transistor pair comprises a second transistor and a second diode-connected transistor, wherein said first diode-connected transistor and said second diode-connected transistor are sized to bias said first transistor and said second transistor in a manner that corrects detrimental effects of offset voltages.

* * * * *

UNITED STATES PATENT AND TRADEMARK OFFICE
CERTIFICATE OF CORRECTION

PATENT NO. : 7,906,992 B2  
APPLICATION NO. : 12/040805  
DATED : March 15, 2011  
INVENTOR(S) : Bult et al.

Page 1 of 1

It is certified that error appears in the above-identified patent and that said Letters Patent is hereby corrected as shown below:

On the Title Page, Item (56), References Cited, please insert

| | | |
|---|---|---|
| --4,549,100 | 10/1985 | Spence |
| 6,639,430 | 10/2003 | Bult et al. |
| 7,352,215 B2 | 4/2008 | Bult et al.-- |

Column 25, line 22, please replace "minor" with --mirror--.  
Column 25, line 23, please replace "minor" with --mirror--.  
Column 25, line 59, please replace "minor" with --mirror--.  
Column 25, line 62, please replace "minor" with --mirror--.  
Column 25, line 63, please replace "minor" with --mirror--.  
Column 25, line 64, please replace "minor" with --mirror--.  
Column 26, line 50, please replace "minor" with --mirror--.  
Column 26, line 54, please replace "minor" with --mirror--.

Signed and Sealed this  
Seventh Day of June, 2011

David J. Kappos  
*Director of the United States Patent and Trademark Office*